(12) United States Patent
Kuroda et al.

(10) Patent No.: US 7,498,615 B2
(45) Date of Patent: Mar. 3, 2009

(54) ELECTRO-STATIC DISCHARGE PROTECTION CIRCUIT AND SEMICONDUCTOR DEVICE HAVING THE SAME

(75) Inventors: Toshikazu Kuroda, Tokyo (JP); Hirokazu Hayashi, Tokyo (JP); Yasuhiro Fukuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 241 days.

(21) Appl. No.: 11/276,403

(22) Filed: Feb. 28, 2006

(65) Prior Publication Data
US 2006/0220136 A1   Oct. 5, 2006

(30) Foreign Application Priority Data
Mar. 30, 2005   (JP) .............................. 2005-098552

(51) Int. Cl.
*H01L 29/74* (2006.01)
(52) U.S. Cl. ................. 257/173; 257/107; 257/355; 257/362; 257/E27.001; 361/56; 361/91.1; 438/121; 438/133
(58) Field of Classification Search ........... 257/107, 257/173, 355, 361, 362; 361/56, 91.1; 438/121, 438/133
See application file for complete search history.

(56) References Cited

U.S. PATENT DOCUMENTS 4,072,976 A * 2/1978 Harari ..................... 257/356
5,939,767 A * 8/1999 Brown et al. .............. 257/551

OTHER PUBLICATIONS

Bart Keppens et al., "ESD Protection Solutions for High Voltage Technologies" 2004 EOS/ESD Symposium.*

* cited by examiner

*Primary Examiner*—Evan Pert
*Assistant Examiner*—Scott R Wilson
(74) *Attorney, Agent, or Firm*—Volentine & Whitt, P.L.L.C.

(57) ABSTRACT

An electro-static discharge protection circuit includes a thyristor mode ensuring circuit and a thyristor rectifier circuit. The thyristor mode ensuring circuit includes a capacitive element connected between a higher potential line and a lower potential line, and ensures a constant and sufficient capacity independently of the number of input/output signal bits, even when the number of input/output signal bits is a theoretical minimum, i.e. 1, so that a surge current induced by electro-static discharge (ESD) applied to an output pad is injected into the first capacitive element to charge it. Thus, by means of the current caused by the surge current, the thyristor rectifier circuit is triggered into a thyristor mode, which allows the surge current to flow to the lower potential line through the thyristor rectifier circuit, protecting circuitry against the surge current.

18 Claims, 25 Drawing Sheets

( Vss < V OUT < Vdd )

ized circuit. Each of the
ELECTRO-STATIC DISCHARGE PROTECTION CIRCUIT AND SEMICONDUCTOR DEVICE HAVING THE SAME

BACKGOUND OF THE INVENTION

1. Field of the Invention

The present invention relates to an electro-static discharge protection circuit to protect internal circuitry from electro-static discharge (ESD).

2. Description of the Related Art

An electro-static discharge protection circuit is established between an input/output terminal and internal circuitry of a semiconductor integrated circuit to protect the internal circuitry against a surge current caused by electro-static discharge (ESD) applied to the input/output terminal. As used herein, the term "internal circuitry" means circuits to be protected against electro-static discharge (ESD) by an electro-static discharge protection circuit.

Electro-static discharge protection circuits using a rectifier with thyristors are known in the art, and one such circuit was disclosed in the 2004 EOS/ESD Symposium, "ESD Protection Solution for High Voltage Technologies", (C. Principle of ESD-on-SCR). The electro-static discharge protection circuit includes a thyristor and a substrate resistance. Application of electro-static discharge (ESD) to an input/output terminal causes a current to be injected or charged into a chip capacitance. The current triggers the electro-static discharge protection circuit into an "ON" state of a thyristor mode. This electro-static discharge protection circuit is disclosed as "ESD-on-SCR (ESD-on-Silicon Controlled Rectifier)". As used herein, the term "electro-static discharge protection circuit" means this type of circuit, that is, SCR.

Electro-static discharge protection circuits are established between a plurality of input/output terminals and internal circuitry of a semiconductor integrated circuit. Each of the input/output terminals is provided for each of input/output signal bits, and typically, connected to each CMOS inverter through each electro-static discharge protection circuit. Each CMOS inverter is connected to an internal logic circuit. The CMOS inverters may be a part of or all of the internal circuitry to be protected against electro-static discharge (ESD).

DESCRIPTION OF THE RELATED ART

As described above, an electro-static discharge protection circuit is triggered into a thyristor mode by a current caused by surge current injected or charged into a chip capacitance. The chip capacitance includes a stray capacitance between a higher potential line and a substrate, a stray capacitance between a lower potential line and the substrate, and a stray capacitance between N-well regions of other electro-static discharge protection circuits and the substrate. The number of the N-well regions of the other electro-static discharge protection circuits depends on the number of input/output signal bits. The lower the number of input/output signal bits, the lower the number of N-well regions of the other electro-static discharge protection circuits. Fewer N-well regions will decrease the total stray capacitances between the N-well regions of the other electro-static discharge protection circuits and the substrate, which in turn will result in a decrease in the chip capacitance. In contrast, the greater the number of input/output signal bits, the lower the number of N-well regions of the other electro-static discharge protection circuits. More N-well regions will increase the total stray capacitances between the N-well regions of the other electro-static discharge protection circuits and the substrate, which in turn will result in an increase in the chip capacitance. Thus the current flow to a chip capacitance from electro-static discharge (ESD) applied to an input/output terminal depends on the number of input/output signal bits. In addition, more input/output signal bits and more current flow to a chip capacitance will decrease the snapback voltage and trigger an electro-static discharge protection circuit into a thyristor mode. In contrast, fewer input/output signal bits and less current flow to a chip capacitance will increase the snapback voltage and trigger an electro-static discharge protection circuit into a thyristor mode. Thus, the snapback voltage to trigger an electro-static discharge protection circuit into a thyristor mode depends on the number of input/output signal bits.

Therefore, in order to use an electro-static discharge protection circuit independently of the number of input/output signal bits, the snapback voltage of an electro-static discharge protection circuit has been required to be at or under an acceptable upper limit independently of the number of input/output signal bits.

In view of the foregoing, an object of the present invention is to provide an electro-static discharge protection circuit which does not have the problems described above.

Another object of the present invention is to provide a semiconductor device with an electro-static discharge protection circuit which does not have the problems described above.

SUMMARY OF THE INVENTION

The present invention provides an electro-static discharge protection circuit which comprises: a first thyristor rectifier circuit that is electrically coupled between first internal circuitry and a first signal input/output section to which a potential that corresponds to either an input signal to the first internal circuitry or an output signal from the first internal circuitry is to be applied, and also electrically coupled between a higher potential line and a lower potential line; and a first thyristor mode ensuring circuit that is electrically coupled between the higher potential line and the lower potential line, and also electrically coupled to the first thyristor rectifier circuit, in order to trigger the first thyristor rectifier circuit into a thyristor mode by means of a surge current applied to the first signal input/output section so that the surge current flows into the lower potential line through the first thyristor rectifier circuit in order to protect the first internal circuitry from the surge current.

According to the present invention, an electrostatic discharge protection circuit to protect a first internal circuitry against a surge current includes a first thyristor rectifier circuit, and a first thyristor mode ensuring circuit that is electrically coupled to the first thyristor rectifier circuit. The first thyristor mode ensuring circuit triggers the first thyristor rectifier circuit into a thyristor mode by means of a surge current applied to a first signal input/output section, and makes the surge current to flow into a lower potential line through the first thyristor rectifier circuit, which allows the first internal circuitry to be protected from the surge current.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
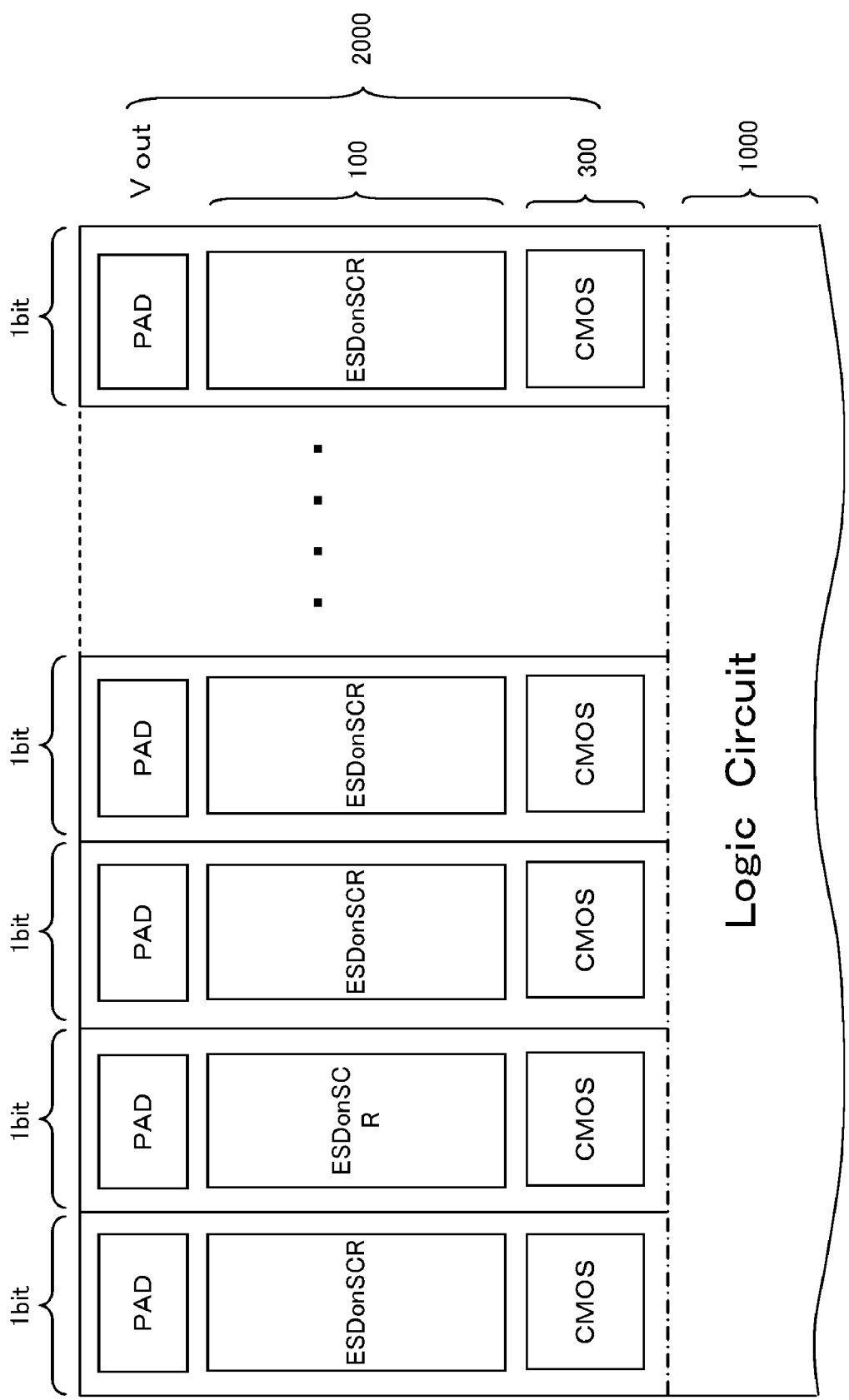
FIG. 1 is a schematic fragmentary plan view of a layout of a semiconductor integrated circuit which includes an electro-static discharge protection circuit and internal circuitry to be protected by the electro-static discharge protection circuit against a surge current induced by electro-static discharge (ESD) according to the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

FIG. 1 is a schematic fragmentary plan view of a layout of a semiconductor integrated circuit, which includes an electro-static discharge protection circuit, and internal circuitry to be protected by the electro-static discharge protection circuit against a surge current induced by electro-static discharge (ESD), according to the present invention.

As shown in FIG. 1, the semiconductor integrated circuit to which the present invention is applied includes a plurality of input/output circuits 2000 that are provided for each of the input/output signal bits, and a logic circuit 1000 electrically connected to the input/output circuits 2000. Each of the input/output circuits 2000 further includes a plurality of input/output pads PAD which are provided for each of input/output signal bits, a plurality of CMOS inverters 300 which are electrically connected to the logic circuit 1000 and provided for each bit of the input/output signal, and a plurality of electro-static discharge protection circuits 100 which are electrically connected to the plurality of CMOS inverters 300 and the input/output pads PAD and provided for each bit of the input/output signal. In each input/output circuit 2000, the electro-static discharge protection circuit 100 is interposed between a CMOS inverter 300 and an input/output pad PAD, and protects the CMOS inverter 300 and the logic circuit 1000 against a surge current induced by electro-static discharge (ESD) applied to the input/output pad PAD.

The semiconductor integrated circuit to which the present invention is applied is formed in a semiconductor substrate and includes a plurality of electro-static discharge protection circuits 100. Each of the electro-static discharge protection circuits 100 has a chip capacitance. The semiconductor integrated circuit is supplied with a higher potential through a higher potential line, and a lower potential through a lower potential line. Between the higher potential line and the lower potential line, there exists a chip capacitance consisting of the above stray capacitances. As described above, the chip capacitance includes a stray capacitance between a higher potential line and a substrate, a stray capacitance between a lower potential line and the substrate, and a stray capacitance between N-well regions of other electro-static discharge protection circuits and the substrate. The number of the N-well regions of the other electro-static discharge protection circuits depends on the number of input/output signal bits. The lower the number of input/output signal bits, the lower the number of N-well regions of the other electro-static discharge protection circuits. Fewer N-well regions will decrease the total stray capacitances between the N-well regions of the other electro-static discharge protection circuits and the substrate, which in turn will result in a decrease in the chip capacitance. In contrast, the greater the number of input/output signal bits, the lower the number of N-well regions of the other electro-static discharge protection circuits. More N-well regions will increase the total stray capacitances between the N-well regions of the other electro-static discharge protection circuits and the substrate, which in turn will result in an increase in the chip capacitance. Thus the current flow to the chip capacitance from the electro-static discharge (ESD) applied to input/output terminals will depend on the number of input/output signal bits.

However, the electro-static discharge protection circuit 100 according to the present invention is different from the conventional ESD-on-SCR described above. As described in the following embodiments, the electro-static discharge protection circuit 100 according to the present invention has a snapback voltage which is independent of the number of input/output signal bits and is at or under an acceptable upper limit. The chip capacitance depends on the number of input/output signal bits. However, the electro-static discharge protection circuit 100 according to the present invention has a thyristor mode ensuring circuit which ensures that the electro-static discharge protection circuit 100 will be triggered into a thyristor mode by a surge current induced by electro-static discharge (ESD) applied to an input/output pad PAD even when the number of input/output signal bits is the theoretical minimum, i.e. 1. In other words, the thyristor mode ensuring circuit serves as a snapback voltage keep circuit which keeps a snapback voltage at or under an acceptable upper limit even when the number of input/output signal bits is the theoretical minimum. This allows the electro-static discharge protection circuits 100 of identical circuit configurations to be in continuous use independently of the number of input/output signal bits, which will be explained in detail below on the basis of embodiments.

(1) First Embodiment

According to a first embodiment, an electro-static discharge protection circuit 100 is provided which includes a thyristor mode ensuring circuit that, independently of the number of input/output signal bits, ensures that the thyristor rectifier circuit will be triggered into a thyristor mode by a surge current induced by electro-static discharge (ESD) applied to an input/output pad PAD. To ensure that the thyristor rectifier circuit is triggered into a thyristor mode by a surge current, the thyristor mode ensuring circuit needs to fulfill the function of keeping a snapback voltage at or under an acceptable upper limit. Hence the thyristor mode ensuring circuit functions both to ensure that a thyristor mode will be triggered, and to keep a snapback voltage at or under an acceptable upper limit.

Figure 2:
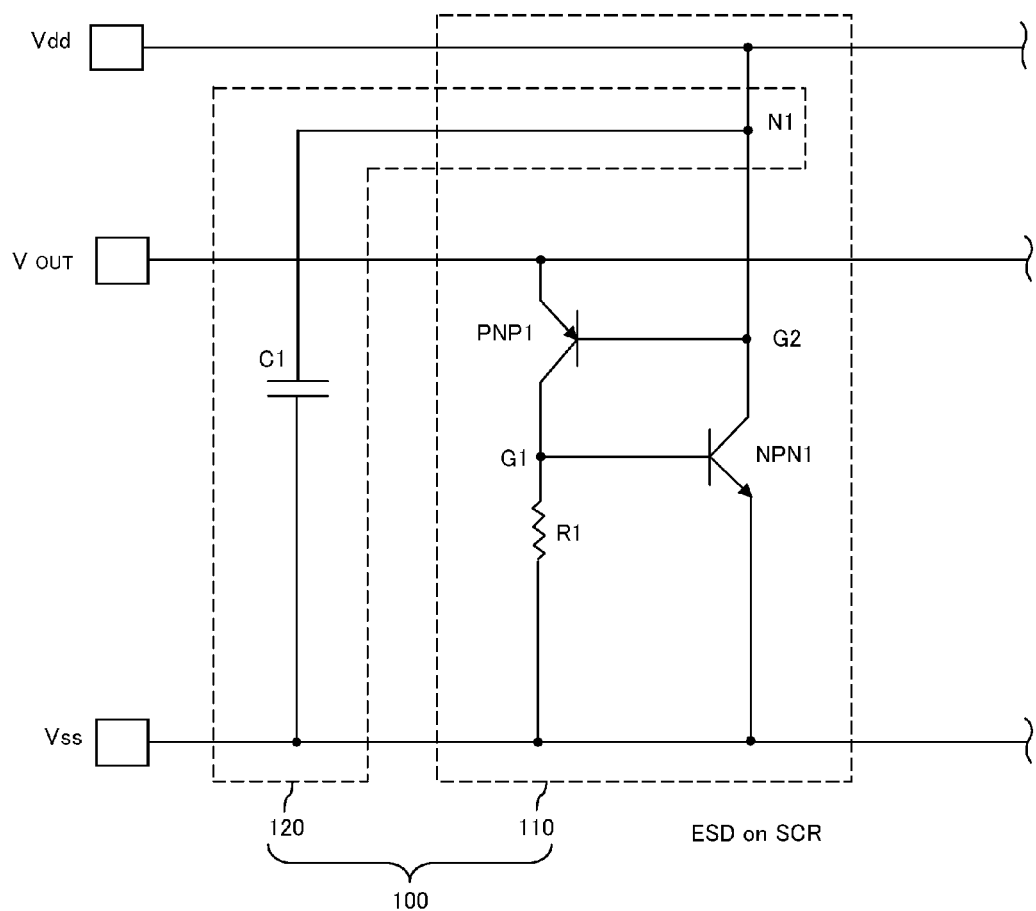
FIG. 2 is an equivalent circuit view of an electro-static discharge protection circuit according to a first embodiment of the present invention.

FIG. 2 is an equivalent circuit view which shows each of the plurality of electro-static discharge protection circuits in FIG. 1. Each electro-static discharge protection circuit 100 is connected to a higher potential line Vdd which supplies a higher potential Vdd, and to a lower potential line Vss which supplies a lower potential Vss. Each electro-static discharge protection circuit 100 is further connected to internal circuitry to be protected against a surge current, and to an output pad Vout which outputs output signals. Although each electro-static discharge protection circuit 100 may be connected to internal circuitry in order to be protected against a surge current and to an input pad Vin to which input signals are input, in this embodiment, the present invention will be explained by way of an example in which electro-static discharge (ESD) is applied to an output pad Vout, with reference to the accompanying drawings.

The potential of the output pad Vout is higher than the lower potential Vss supplied through a lower potential supply line, and lower than the higher potential Vdd supplied through a higher potential supply line. Basically, the potential of the output pad Vout is lower than the higher potential Vdd supplied through a higher potential supply line at all times.

The electro-static discharge protection circuit 100 includes a thyristor rectifier circuit 110, and a thyristor mode ensuring circuit 120 which is electrically connected to and functionally coupled to the thyristor rectifier circuit 110.

The thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to an output pad Vout. The vertical PNP bipolar transistor PNP1 has a collector which is connected to a first terminal G1 and to the lower potential line Vss through the substrate resistance R1. The vertical PNP bipolar transistor PNP1 has a base which is connected to the higher potential line Vdd via a second terminal G2. The lateral NPN bipolar transistor NPN1 has a collector which is connected to the base of the vertical PNP bipolar transistor PNP1 via the second terminal G2 and to the higher potential line Vdd. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 120 includes a first capacitive element C1 which is connected between the higher potential line Vdd and the lower potential line Vss. The first capacitive element C1 has a first electrode which is connected to the higher potential line Vdd through a first node N1, to the base of the vertical PNP bipolar transistor PNP1, and to the collector of the lateral NPN bipolar transistor NPN1. The first capacitive element C1 has a second electrode which is connected to the lower potential line Vss. Unlike the above mentioned chip capacitance of stray capacitances, the capacitance provided by the first capacitive element C1 is constant independently of the number of input/output signal bits.

As described above with reference to FIG. 1, an input/output circuit 2000 is provided for each of the input/output signal bits. Each input/output circuit 2000 includes an output pad Vout, an electro-static discharge protection circuit 100 connected to the output pad Vout, and a CMOS inverter 300 connected to the electro-static discharge protection circuit 100. The CMOS inverter 300 provides an output stage of a logic circuit 1000. Between the higher potential line and the lower potential line, there exists the above mentioned chip capacitance of stray capacitances. As described above, the chip capacitance includes a stray capacitance between the higher potential line and the substrate, a stray capacitance between the lower potential line and the substrate, and a stray capacitance between the N-well regions of other electro-static discharge protection circuits 100 and the substrate. The number of the N-well regions of the other electro-static discharge protection circuits 100 depends on the number of input/output signal bits. The current flow to the chip capacitance from the electro-static discharge (ESD) applied to the input/output terminals depends on the number of input/output signal bits.

However, the electro-static discharge protection circuit 100 includes the first capacitive element C1 connected between the higher potential line Vdd and the lower potential line Vss other than the chip capacitance of stray capacitances. The capacitance provided by the first capacitive element C1 is constant independently of the number of input/output signal bits, unlike the above chip capacitance of stray capacitances. That is, the first capacitive element C1 connected between the higher potential line Vdd and the lower potential line Vss ensures a constant and sufficient capacity independently of the number of input/output signal bits, even when the number of input/output signal bits is the theoretical minimum, i.e. 1, so that a surge current induced by electro-static discharge (ESD) applied to the output pad Vout is injected into the first capacitive element C1 in order to charge it. Thus, by means of the current caused by the surge current, the thyristor rectifier circuit 110 is triggered into a thyristor mode.

When a surge current is applied to the output pad Vout, a current flows from the emitter to the base of the vertical PNP bipolar transistor PNP1. From the base, the current flows to the first capacitive element C1 via the second terminal G2 to charge the first capacitive element C1. This means the first capacitive element C1 provides a constant and sufficient capacitance independently of the number of input/output signal bits. The first capacitive element C1, other than the stray capacitances, ensures the flow of a surge current applied to the output pad Vout into the first capacitive element C1 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electrostatic discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus, as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by the surge current, the thyristor rectifier circuit 110 is triggered into a thyristor mode.

Therefore, even when the number of input/output signal bits is 1, i.e. the theoretical minimum, the first capacitive element C1 connected between the higher potential line Vdd and the lower potential line Vss ensures that the thyristor rectifier circuit 110 will be triggered into a thyristor mode by a surge current induced by electro-static discharge (ESD) applied to an input/output pad PAD. This means that even when the number of input/output signal bits is 1, i.e. the theoretical minimum, the first capacitive element C1 connected between the higher potential line Vdd and the lower potential line Vss will keep the snapback voltage of the thyristor rectifier circuit 110 at or under an acceptable upper limit. In this way, the thyristor mode ensuring circuit 120 including the first capacitive element C1 connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 120 is not necessary. However, the combination of the thyristor rectifier circuit 110 and the thyristor mode ensuring circuit 120 allows the electro-static discharge protection circuit 100 to be in continuous use independently of the number of input/output signal bits.

Specifically, the thyristor mode ensuring circuit 120, which includes the first capacitive element C1 connected between the higher potential line Vdd and the lower potential line Vss, reliably ensures that the thyristor rectifier circuit 110 will be triggered into a thyristor mode by a surge current induced by electro-static discharge (ESD) applied to an input/output pad PAD, independently of the number of input/output signal bits.

Figure 3:
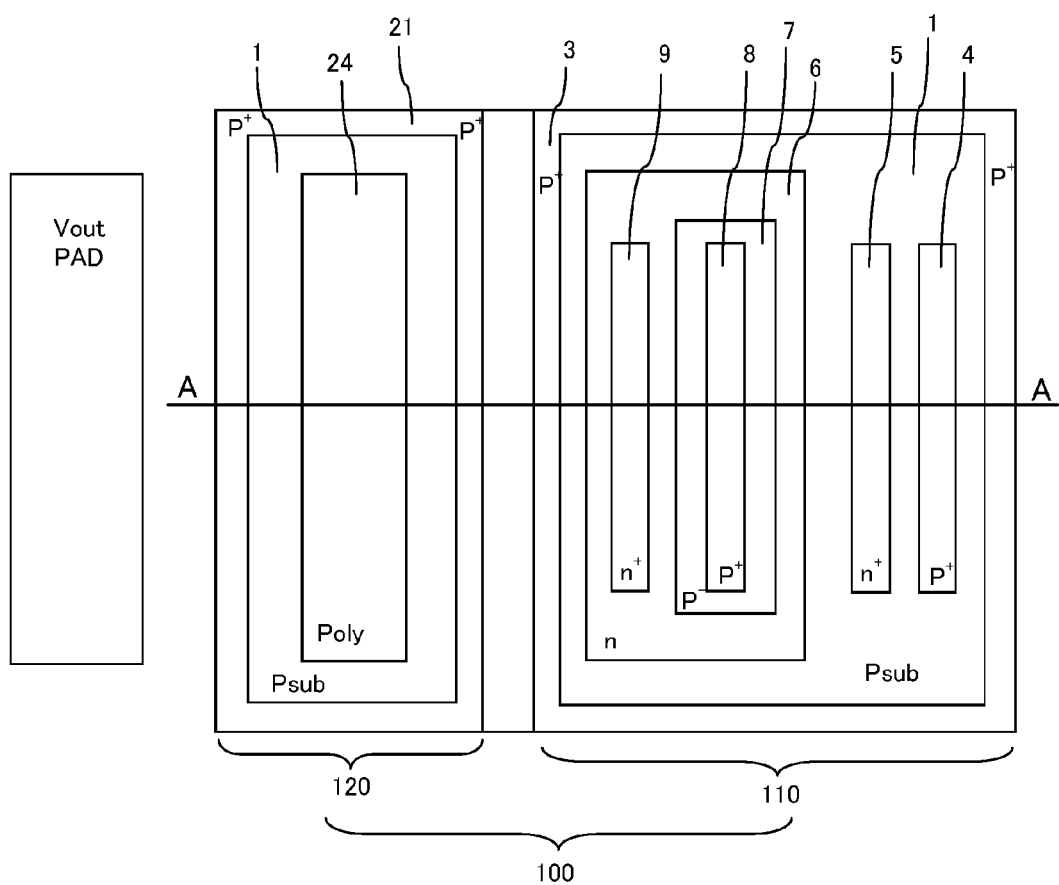
FIG. 3 is a schematic plan view of a schematic layout of the electro-static discharge protection circuit in FIG. 2 according to the first embodiment of the present invention which is formed in a semiconductor substrate.
Figure 4:
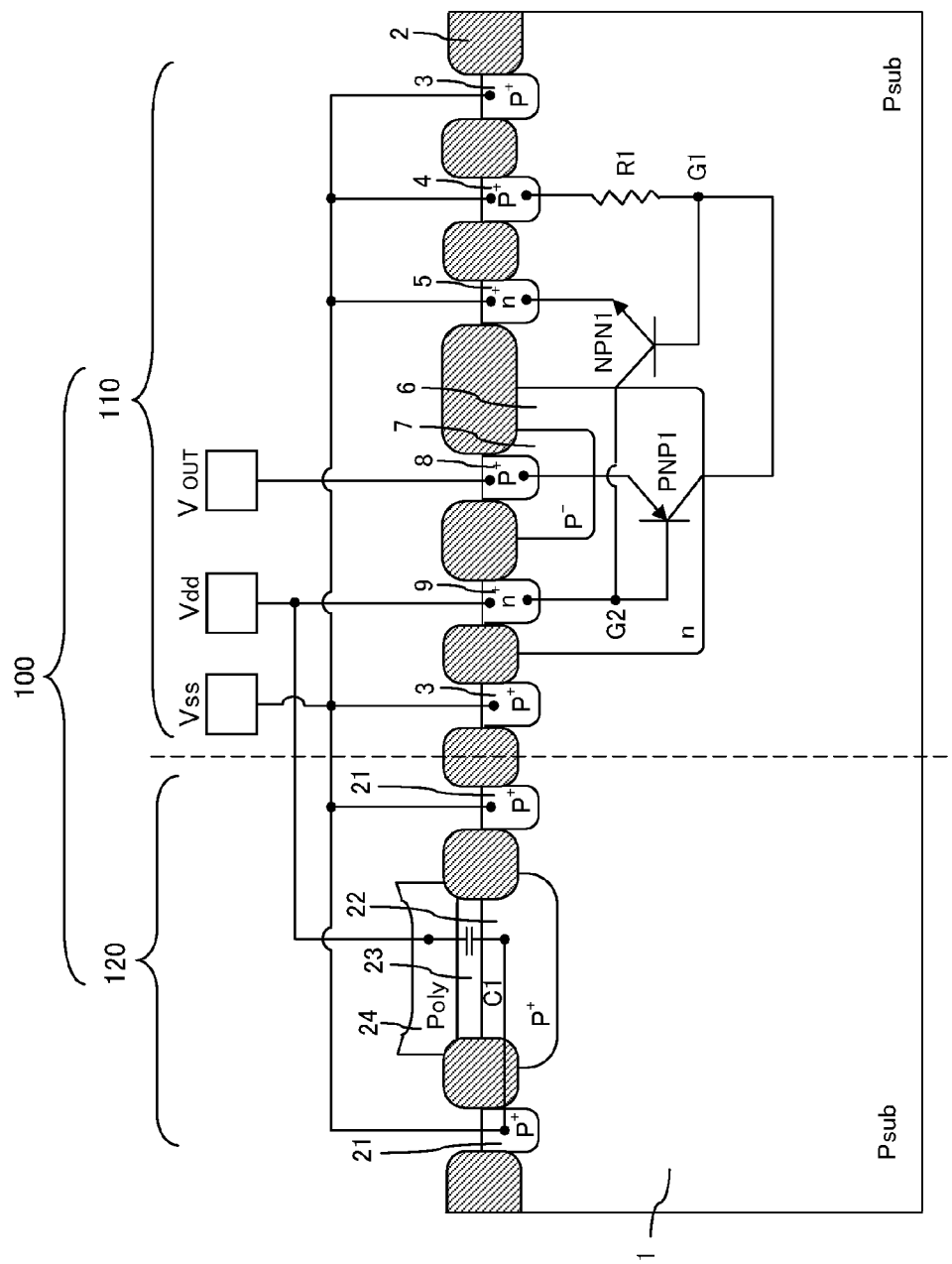
FIG. 4 is a schematic fragmentary longitudinal sectional view of the electro-static discharge protection circuit according to the first embodiment of the present invention taken along A-A line in FIG. 3.

The electro-static discharge protection circuit 100 shown in the above mentioned equivalent circuit view is formed in a semiconductor substrate. Now a layout of the electro-static discharge protection circuit 100 will be explained below. FIG. 3 is a schematic plan view of a schematic layout of the electro-static discharge protection circuit in FIG. 2 which is formed in a semiconductor substrate. FIG. 4 is a schematic sectional fragmentary longitudinal view of a schematic layout of the electro-static discharge protection circuit taken along A-A line in FIG. 3.

As shown in FIG. 3, and as described above, an electro-static discharge protection circuit 100 includes a thyristor rectifier circuit 110 and a thyristor mode ensuring circuit 120. The thyristor mode ensuring circuit 120 is established between an output pad Vout and the thyristor rectifier circuit 110. The electro-static discharge protection circuit 100, and internal circuitry to be protected against a surge current by the electro-static discharge protection circuit 100, are formed in a P-type single-crystal semiconductor substrate 1. The electro-static discharge protection circuit 100 is interposed between an input/output pad PAD and the internal circuitry, and as described above, includes the thyristor rectifier circuit 110 and the thyristor mode ensuring circuit 120. The thyristor mode ensuring circuit 120 is provided between the output pad Vout and the thyristor rectifier circuit 110. The thyristor rectifier circuit 110 is provided between the thyristor mode ensuring circuit 120 and the internal circuitry.

As shown in FIG. 3 and FIG. 4, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a P$^+$ guard ring 3 in the P-type single-crystal semiconductor substrate 1, while the thyristor mode ensuring circuit 120 is formed in active regions within a region surrounded by a P$^+$ guard ring 21 in the P-type single-crystal semiconductor substrate 1.

The region to establish the thyristor rectifier circuit 110 in the P-type single-crystal semiconductor substrate 1 contains a P$^+$ impurity diffusion region 4, a N$^+$ impurity diffusion region 5 separated by a field oxide film 2 from the P$^+$ impurity diffusion region 4, and an N-well region 6 separated by a field oxide film 2 from the N$^+$ impurity diffusion region 5. The N-well region 6 further contains an N$^+$ impurity diffusion region 9, and a P$^-$ impurity diffusion region 7 separated from the N$^+$ impurity diffusion region 9. The P$^-$ impurity diffusion region 7 further contains a P$^+$ impurity diffusion region 8.

The P$^-$ impurity diffusion region 7 corresponds to the emitter of the vertical PNP bipolar transistor PNP1, the emitter being connected to the output pad Vout through the P$^+$ impurity diffusion region 8. The N-well region 6 corresponds to the base of the vertical PNP bipolar transistor PNP1, the base being connected to the higher potential line Vdd through the N$^+$ impurity diffusion region 9. The P-type single-crystal semiconductor substrate 1 corresponds to the collector of the vertical PNP bipolar transistor PNP1, the collector being connected to the lower potential line Vss through the P$^+$ impurity diffusion region 4. The P-type single-crystal semiconductor substrate 1 also corresponds to the base of the lateral NPN bipolar transistor NPN1, the base being connected to the lower potential line Vss through the P$^+$ impurity diffusion region 4. The N-well region 6 corresponds to the collector of the lateral NPN bipolar transistor NPN1, the collector being connected to the higher potential line Vdd through the N$^+$ impurity diffusion region 9. The N$^+$ impurity diffusion region 5 corresponds to the emitter of the lateral NPN bipolar transistor NPN1, the emitter being connected to the lower potential line Vss. Resistance to the current flow in the P-type single-crystal semiconductor substrate 1 corresponds to the substrate resistance R1.

The region in the P-type single-crystal semiconductor substrate 1 to establish the thyristor mode ensuring circuit 120 is provided with a P$^+$ impurity diffusion region 22 separated by a field oxide film 2 from a P$^+$ guard ring 21, a first dielectric film 23 extending over the P$^+$ impurity diffusion region 22, and a first polysilicon layer 24 extending over the first dielectric film 23. The P$^+$ impurity diffusion region 22, the first dielectric film 23, and the first polysilicon layer 24 form the first capacitive element C1. That is the first capacitive element C1 consists of a MOS capacitor. The first polysilicon layer 24 corresponds to the second electrode of the first capacitive element C1, the second electrode being connected to the lower potential line Vss through the P-type single-crystal semiconductor substrate 1 and the P$^+$ guard ring 21.

When a surge current is applied to the output pad Vout, a forward current flows from the P$^-$ impurity diffusion region 7 which forms the emitter of the vertical PNP bipolar transistor PNP1 to the N-well region 6 which forms the base of the vertical PNP bipolar transistor PNP1 through the PN junction. The forward current further flows from the N-well region 6 which forms the base, to the first polysilicon layer 24 which forms the first electrode of the first capacitive element C1, through the N$^+$ impurity diffusion region 9 which forms second terminal G2, to charge the first capacitive element C1 which is formed of the P$^+$ impurity diffusion region 22, the first dielectric film 23, and the first polysilicon layer 24. This allows the first capacitive element C1 to provide a constant and sufficient capacitance independently of the number of input/output signal bits. The first capacitive element C1, other than the stray capacitances, consistently ensures the flow of a surge current applied to the output pad Vout into the first capacitive element C1 through the emitter and the base of the vertical PNP bipolar transistor PNP1 independently of the number of input/output signal bits. As a result, the potential of the N-well region 6 which forms the base of the vertical PNP bipolar transistor PNP1 rises.

As the potential of the N-well region 6 which forms the base rises, and the potential difference between the emitter and the base of the vertical PNP bipolar transistor PNP1, namely, the difference between the potential of the N-well region 6 and the potential of the P$^-$ impurity diffusion region 7, reaches a threshold voltage Vbe, the vertical PNP bipolar transistor PNP1 turns on. This turning on causes the surge current applied to the output pad Vout to flow from the P$^-$ impurity diffusion region 7 which forms the emitter of the vertical PNP bipolar transistor PNP1, to the P-type single-crystal semiconductor substrate 1 which forms the collector through the N-well region 6, further to the lower potential line Vss through the substrate resistance R1 and the P$^+$ impurity diffusion region 4. In other words, the collector current of the vertical PNP bipolar transistor PNP1 flows into the P-type single-crystal semiconductor substrate 1 in which the electro-static discharge protection circuit 100 is formed. This flow causes the voltage across the resistance R1 to drop, and the potential of the P-type single-crystal semiconductor substrate 1 to rise. Since the P-type single-crystal semiconductor substrate 1 forms the collector of the vertical PNP bipolar transistor PNP1 and the base of the lateral NPN bipolar transistor NPN1, the potential of the collector of the vertical PNP bipolar transistor PNP1 is equal to the potential of the base of the lateral NPN bipolar transistor NPN1. Therefore, the potential rise of the P-type single-crystal semiconductor substrate 1 corresponds to the potential rise of the base of the lateral NPN bipolar transistor NPN1.

Meanwhile, the $N^+$ impurity diffusion region 5 which forms the emitter of the lateral NPN bipolar transistor NPN1 is fixed at a lower potential supplied through the lower potential line Vss. Thus as the potential of the P-type single-crystal semiconductor substrate 1 which forms the base of the lateral NPN bipolar transistor NPN1 rises, and the potential difference between the emitter and the base of the lateral NPN bipolar transistor NPN1, namely, the difference between the potential of the P-type single-crystal semiconductor substrate 1 and the potential of the $N^+$ impurity diffusion region 5, reaches a threshold voltage Vbe, the lateral NPN bipolar transistor NPN1 turns on. This turning on causes the surge current to flow from the N-well region 6 which forms the collector of the lateral NPN bipolar transistor NPN1 to the $N^+$ impurity diffusion region 5 which forms the emitter through the P-type single-crystal semiconductor substrate 1. In other words, by means of the surge current, the thyristor rectifier circuit 110 is triggered into a thyristor mode.

The above mentioned electro-static discharge protection circuit 100 includes a first capacitive element C1 connected between a higher potential line Vdd and a lower potential line Vss, other than a chip capacitance of stray capacitances. The capacitance provided by the first capacitive element C1 is constant independently of the number of input/output signal bits, unlike the chip capacitance of stray capacitances. Therefore, even when the number of input/output signal bits is 1, i.e. the theoretical minimum, the first capacitive element C1 connected between a higher potential line Vdd and a lower potential line Vss ensures that the thyristor rectifier circuit 110 will be triggered into a thyristor mode by a surge current induced by electro-static discharge (ESD) applied to an input/output pad PAD. This means that even when the number of input/output signal bits is 1, i.e. the theoretical minimum, the first capacitive element C1 connected between a higher potential line Vdd and a lower potential line Vss keeps the snapback voltage of the thyristor rectifier circuit 110 at or under an acceptable upper limit. In this way, the thyristor mode ensuring circuit 120 including the first capacitive element C1 connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 120 is not necessary. However, the combination of the thyristor rectifier circuit 110 and the thyristor mode ensuring circuit 120 allows the electro-static discharge protection circuit 100 to be in continuous use independently of the number of input/output signal bits.

Specifically, the thyristor mode ensuring circuit 120 which includes the first capacitive element C1 connected between the higher potential line Vdd and the lower potential line Vss reliably ensures that the thyristor rectifier circuit 110 will be triggered into a thyristor mode by a surge current induced by electro-static discharge (ESD) applied to an input/output pad PAD, independently of the number of input/output signal bits.

Modification

As described above with reference to FIG. 1, an electro-static discharge protection circuit 100 according to the first embodiment is interposed between an input/output pad PAD and internal circuitry to be protected against a surge current. The internal circuitry typically includes a logic circuit 1000. A mechanism to protect a CMOS inverter 300 against a surge current by an electro-static discharge protection circuit 100 according to the first embodiment will be explained below by way of an example, in which an output pad Vout is used for an input/output pad PAD and a CMOS inverter 300 provides an output stage of the logic circuit 1000.

Figure 5:
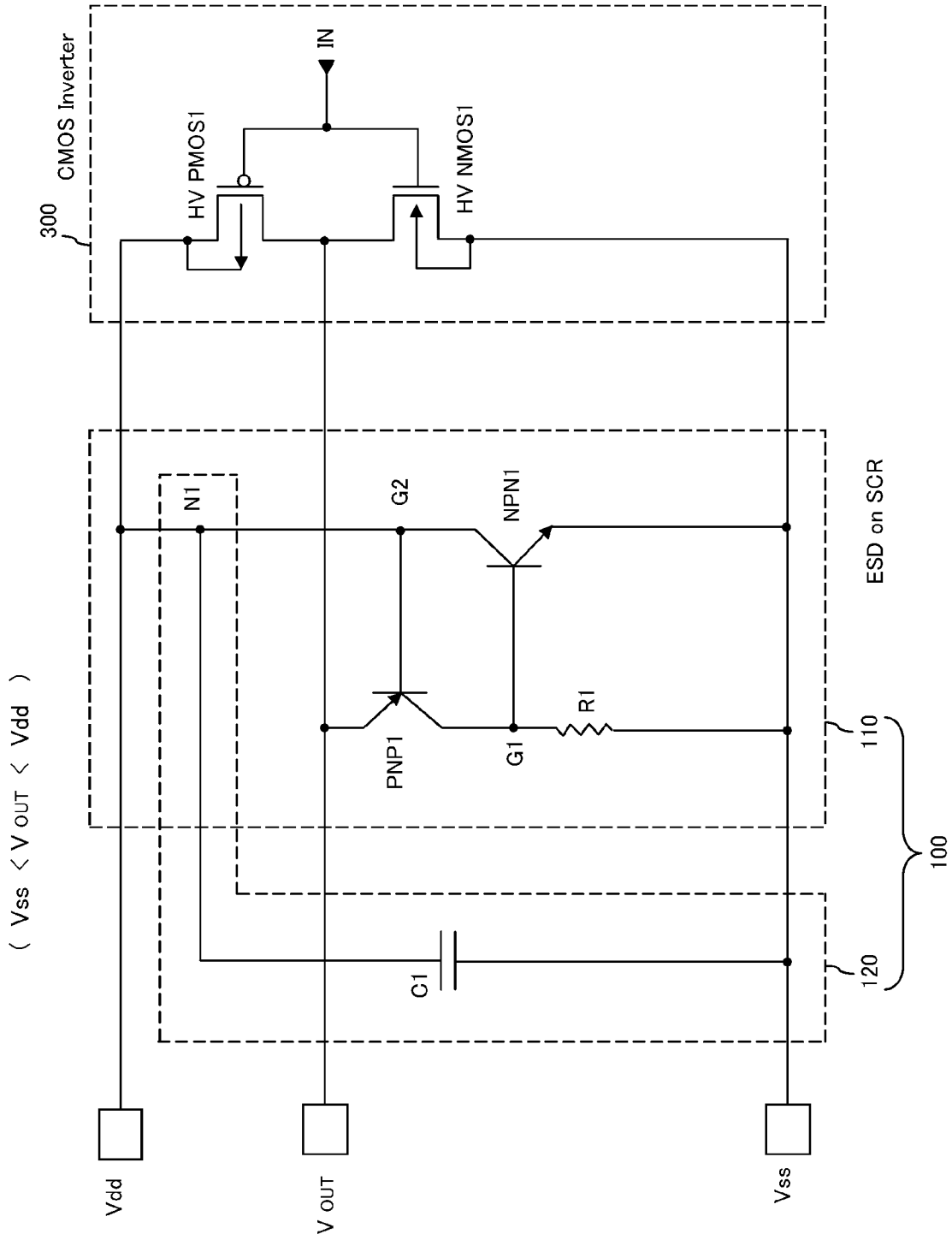
FIG. 5 is an equivalent circuit view of a circuit configuration which includes the electro-static discharge protection circuit according to the first embodiment of the present invention in FIG. 2 and a CMOS inverter to be protected against a surge current by the electro-static discharge protection circuit.
Figure 6:
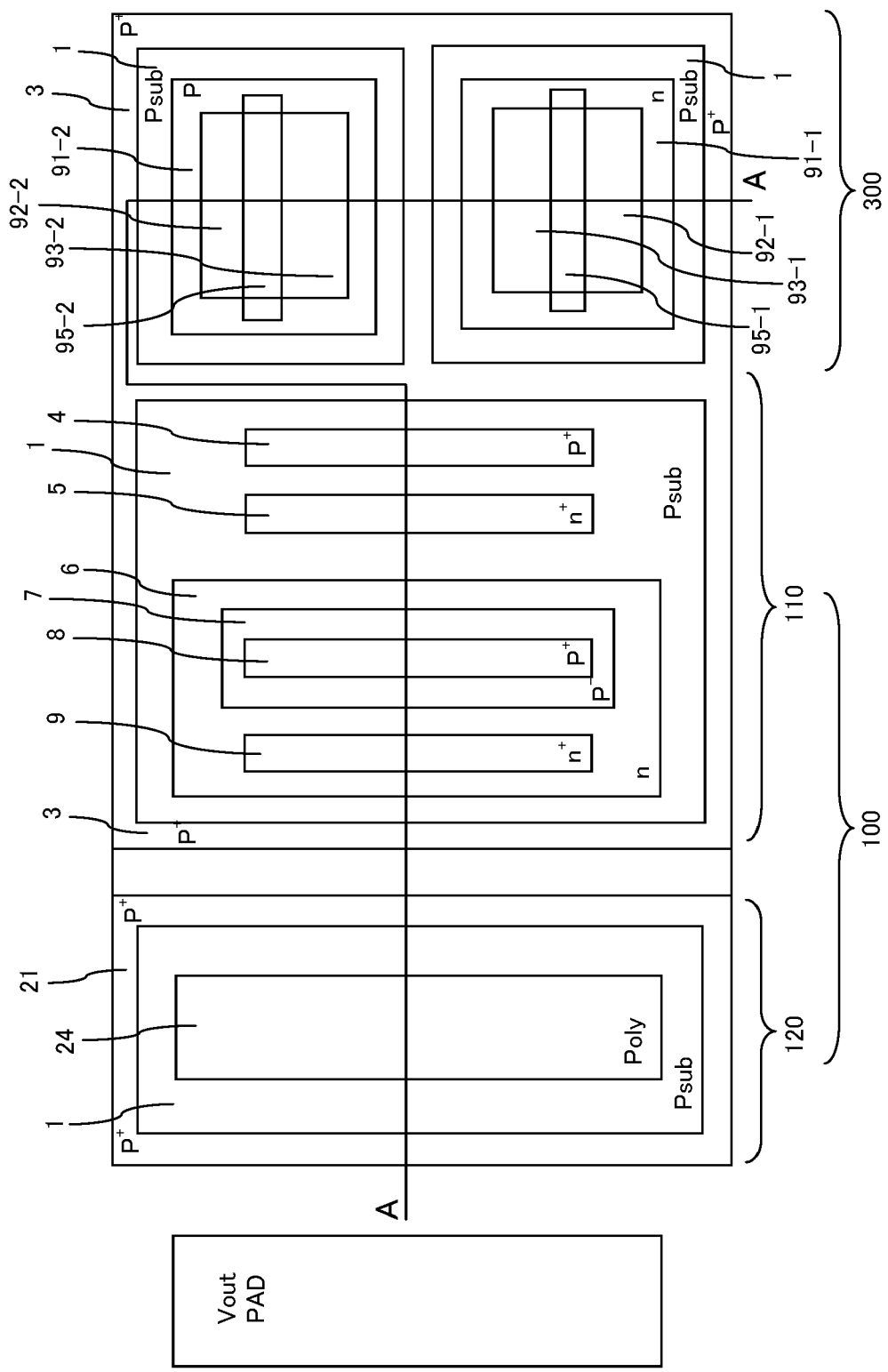
FIG. 6 is a schematic plan view of a schematic layout of a circuit which includes the electro-static discharge protection circuit according to the first embodiment of the present invention in FIG. 5 formed in a semiconductor substrate, and a CMOS inverter to be protected against a surge current by the electro-static discharge protection circuit.
Figure 7:
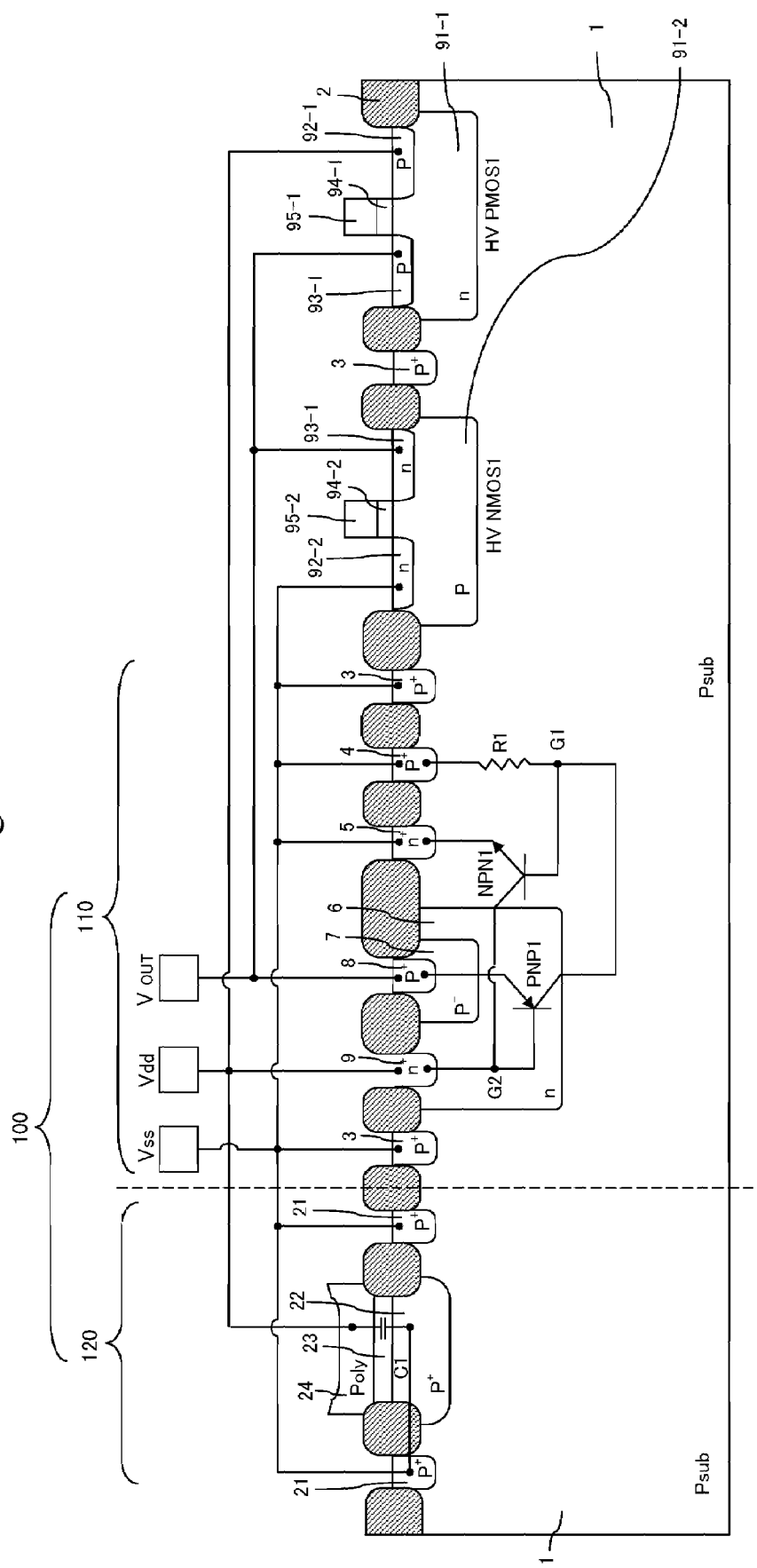
FIG. 7 is a schematic fragmentary longitudinal sectional view of a schematic layout of the electro-static discharge protection circuit according to the first embodiment of the present invention taken along A-A line in FIG. 6.

FIG. 5 is an equivalent circuit view of a circuit configuration which includes an electro-static discharge protection circuit according to the first embodiment of the present invention in FIG. 2, and a CMOS inverter to be protected against a surge current by the electro-static discharge protection circuit. FIG. 6 is a schematic plan view of a schematic layout of a circuit which includes the electro-static discharge protection circuit according to the first embodiment of the present invention in FIG. 5 formed in a semiconductor substrate, and a CMOS inverter to be protected against a surge current by the electro-static discharge protection circuit. FIG. 7 is a schematic fragmentary longitudinal sectional view of a schematic layout of the electro-static discharge protection circuit of the first embodiment according to the present invention taken along the A-A line of FIG. 6.

As shown in FIG. 5, an electro-static discharge protection circuit 100 includes a thyristor rectifier circuit 110 and a thyristor mode ensuring circuit 120. The thyristor rectifier circuit 110 and the thyristor mode ensuring circuit 120 provide the same configurations, operations and effects as the described above, which will not be explained herein below. Rather, a mechanism in which the electro-static discharge protection circuit 100 protects a CMOS inverter against a surge current will be described.

A CMOS inverter 300 is connected between a higher potential line Vdd and a lower potential line Vss. The CMOS inverter 300 includes a high voltage P-channel MOS transistor HVPMOS1 and a high voltage N-channel MOS transistor HVNMOS1. The high voltage P-channel MOS transistor HVPMOS1 is connected between the higher potential line Vdd and the high voltage N-channel MOS transistor HVNMOS1, while the high voltage N-channel MOS transistor HVNMOS1 is connected between the high voltage P-channel MOS transistor HVPMOS1 and the lower potential line Vss.

The high voltage P-channel MOS transistor HVPMOS has a gate. To the gate, a signal which is the inversion of an output from a logic circuit 1000 is input as an input signal IN. The high voltage P-channel MOS transistor HVPMOS1 has a source which is connected to the higher potential line Vdd. The high voltage P-channel MOS transistor HVPMOS1 has a drain which is connected to an output terminal of the CMOS inverter 300, which in turn is connected to an output pad Vout. A vertical PNP bipolar transistor PNP1 in the thyristor rectifier circuit 110 has an emitter which is also connected to the output pad Vout. In this way, the drain of the high voltage P-channel MOS transistor HVPMOS1 is also connected to the emitter of the vertical PNP bipolar transistor PNP1.

The high voltage N-channel MOS transistor HVNMOS1 has a gate. To the gate, a signal which is the inversion of an output from a logic circuit 1000 is input as an input signal 1N. The high voltage N-channel MOS transistor HVNMOS1 has a source which is connected to the lower potential line Vss. The high voltage N-channel MOS transistor HVNMOS1 has a drain which is connected to an output terminal of the CMOS inverter 300, which in turn is connected to an output pad Vout. The emitter of the vertical PNP bipolar transistor PNP1 in the thyristor rectifier circuit 110 is also connected to the output pad Vout. In this way, the drain of the high voltage N-channel MOS transistor HVNMOS1 is also connected to the emitter of the vertical PNP bipolar transistor PNP1.

As described above, when a surge current is applied to the output pad Vout, the thyristor mode ensuring circuit 120 immediately turns the thyristor rectifier circuit 110 into a thyristor mode. As a result, the surge current flows into the lower potential line Vss through the thyristor rectifier circuit 110. In other words, the thyristor mode ensuring circuit 120 immediately triggers the thyristor rectifier circuit 110 into a thyristor mode by means of the surge current applied to the output pad Vout independently of the number of input/output signal bits. This ensures that the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. By this means, the electro-static discharge protection circuit 100 reliably protects the CMOS inverter 300 against the surge current applied to the output pad Vout.

As shown in FIG. 6 and FIG. 7, the electro-static discharge protection circuit 100 and the logic circuit 1000 with the CMOS inverter 300 are provided in a P-type single-crystal semiconductor substrate 1. In other words, the electro-static discharge protection circuit 100 and the logic circuit 1000 with the CMOS inverter 300 reside in the same substrate. The electro-static discharge protection circuit 100 has the same layout as those shown in FIG. 3 and FIG. 4, which will not be explained herein below. Rather, a layout of a CMOS inverter 300 will be described.

A CMOS inverter 300 is provided between an electro-static discharge protection circuit 100 and a logic circuit 1000 in FIG. 1. As described above, the CMOS inverter 300 includes a high voltage P-channel MOS transistor HVPMOS1 and a high voltage N-channel MOS transistor HVNMOS1. An N-well region 91-1 and a P-well region 91-2 are provided respectively in active regions defined by a field oxide film 2 and surrounded by a P+ guard ring 3 in a P-type single-crystal semiconductor substrate 1. The high voltage P-channel MOS transistor HVPMOS is provided in the N-well region 91-1, and the high voltage N-channel MOS transistor HVNMOS1 is provided in the P-well region 91-2.

The high voltage P-channel MOS transistor HVPMOS1 has a source region 92-1 and a drain region 93-1, which are P-type impurity diffusion regions separated from each other in the N-well region 91-1. Between the source region 92-1 and the drain region 93-1 is defined a channel region. The high voltage P-channel MOS transistor HVPMOS1 has a gate insulator film 94-1 which is provided on the channel region, and a gate electrode 95-1 which is provided on the gate insulator film 94-1.

The high voltage N-channel MOS transistor HVNMOS1 has a source region 92-2 and a drain region 93-2, which are N-type impurity diffusion regions separated from each other in the P-well region 91-2. Between the source region 92-2 and the drain region 93-2 is defined a channel region. The high voltage N-channel MOS transistor HVNMOS1 has a gate insulator film 94-2 which is provided on the channel region, and a gate electrode 95-2 which is provided on the gate insulator film 94-2.

As described above, when a surge current is applied to an output pad Vout, the thyristor mode ensuring circuit 120 immediately turns the thyristor rectifier circuit 110 into a thyristor mode. As a result, the surge current flows into the lower potential line Vss through the thyristor rectifier circuit 110. In other words, the thyristor mode ensuring circuit 120 immediately makes the thyristor rectifier circuit 110 to be triggered into a thyristor mode by the surge current applied to the output pad Vout independently of the number of input/output signal bits. This ensures that the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. This means the electro-static discharge protection circuit 100 reliably ensures that the CMOS inverter 300 will be protected against the surge current applied to the output pad Vout independently of the number of input/output signal bits.

Modification

The foregoing description is based on the assumption that the output signal voltage level on an output pad Vout from a logic circuit 1000 is constantly at or under a higher potential Vdd supplied through a higher potential line Vdd and also at or greater than a lower potential Vss supplied through a lower potential line Vss. However, the input/output signal voltage level on an input/output pad Vin/out can be transiently greater than a higher potential Vdd. To manage such a case, the circuit configuration of an electro-static discharge protection circuit 100 is preferably modified in a way explained below, so that the current should be inhibited from flowing from an output pad Vout to a higher potential line Vdd.

Figure 8:
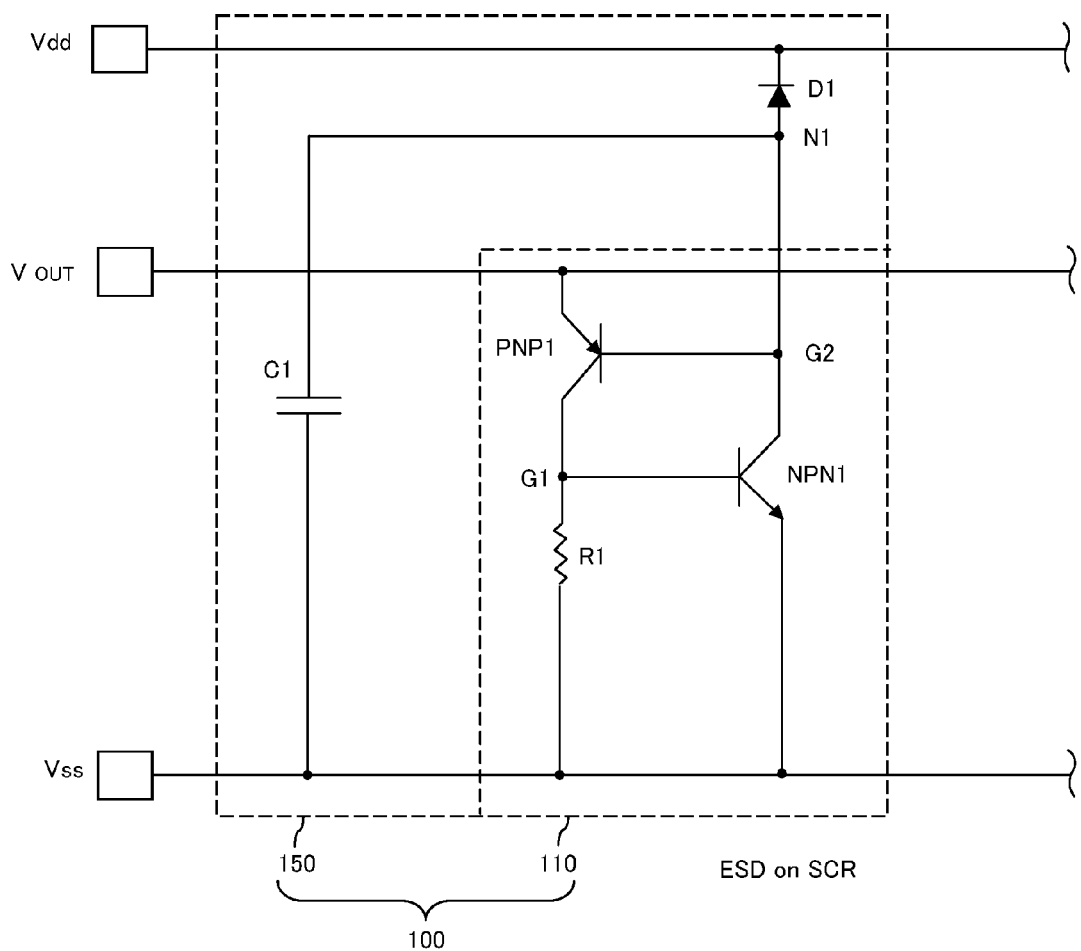
FIG. 8 is an equivalent circuit view of a modification of the electro-static discharge protection circuit according to the first embodiment of the present invention.
Figure 9:
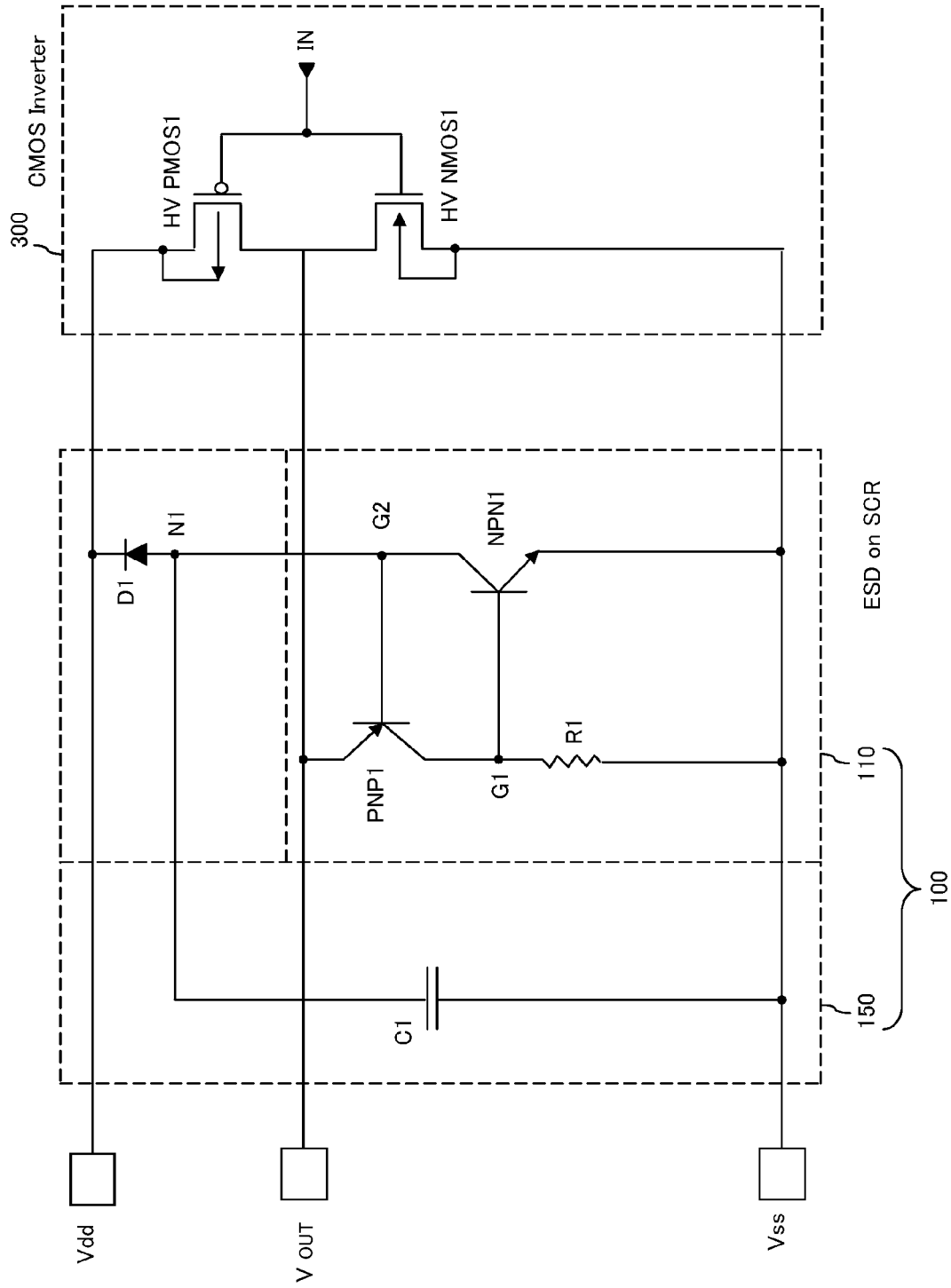
FIG. 9 is an equivalent circuit view of a circuit configuration which includes a modification of the electro-static discharge protection circuit according to the first embodiment of the present invention in FIG. 8 and a CMOS inverter to be protected against a surge current by the electro-static discharge protection circuit.

FIG. 8 is an equivalent circuit view of a modified electro-static discharge protection circuit according to the first embodiment of the present invention. FIG. 9 is an equivalent circuit view of a circuit configuration which includes a modified electro-static discharge protection circuit according to the first embodiment of the present invention in FIG. 8 and a CMOS inverter to be protected against a surge current by the electro-static discharge protection circuit. The electro-static discharge protection circuit 100 includes a thyristor rectifier circuit 110, and a thyristor mode ensuring circuit 150 which is electrically connected to and functionally coupled to the thyristor rectifier circuit 110.

A thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to an output pad Vout. The vertical PNP bipolar transistor PNP1 has a collector which is connected to a first terminal G1 and to a lower potential line Vss through the substrate resistance R1. The vertical PNP bipolar transistor PNP1 has a base which is connected to a first node N1 via a second terminal G2. The lateral NPN bipolar transistor NPN1 has a collector which is connected to the base of the vertical PNP bipolar transistor PNP1 via the second terminal G2 and to the first node N1. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 150 includes a first capacitive element C1 which is connected between the first node N1 and the lower potential line Vss, and a multistage series connection of a plurality of diodes D1 which are connected between the first node N1 and the higher potential line Vdd. The first capacitive element C1 has a first electrode which is connected to the higher potential line Vdd through the first node N1 and the multistage series connection of a plurality of diodes D1, to the base of the vertical PNP bipolar transistor PNP1, and to the collector of the lateral NPN bipolar transistor NPN1. The collector of the lateral NPN bipolar transistor NPN1 is connected to the higher potential line Vdd through the first node N1 and the multistage series connection of a plurality of diodes D1. Similarly, the base of the vertical PNP bipolar transistor PNP1 is connected to the higher potential line Vdd through the first node N1 and the multistage series connection of a plurality of diodes D1. The first capacitive element C1 has a second electrode which is connected to the lower potential line Vss. Unlike the above chip capacitance of stray capacitances, the capacitance provided by the first capacitive element C1 is constant independently of the number of input/output signal bits.

The multistage series connection of a plurality of diodes D1 between the first node N1 and the higher potential line Vdd inhibits a current from flowing from an output pad Vout into the higher potential line Vdd when a voltage level of an input/output signal on an input/output pad Vin/out transiently exceeds a higher potential Vdd. Here, each of the plurality of diodes D1 is considered to have a forward voltage drop VF. And assuming that an n number of diodes D1 are connected in series, when a current flows from the output pad Vout to the higher potential line Vdd, VF×n will be the sum of the forward voltage drops across the diodes D1 due to the multistage series connection of the n number of diodes D1. Determining the n value so that the VF×n will be greater than the value of the input/output signal voltage on the input/output pad Vin/out minus the higher potential Vdd allows the multistage series connection of the n number of diodes D1 to inhibit a current from flowing from the output pad Vout to the higher potential line Vdd, even when a voltage level of an input/output signal on an input/output pad Vin/out transiently exceeds a higher potential Vdd. This prevents power consumption from increasing unnecessarily.

In addition, the multistage series connection of a plurality of diodes D1 between the first node N1 and the higher potential line Vdd does not give any adverse effect on the operation of the electrostatic discharge protection circuit 100 described above, which will be explained below.

When a surge current is applied to the output pad Vout, a current flows from the emitter to the base of the vertical PNP bipolar transistor PNP1. Due to the multistage series connection of a plurality of diodes D1 between the base of the vertical PNP bipolar transistor PNP1 and the higher potential line Vdd, the current further flows from the base to the first capacitive element C1 to charge the first capacitive element C1. This means the first capacitive element C1 provides a constant and sufficient capacitance independently of the number of input/output signal bits. The first capacitive element C1, other than the stray capacitances, consistently ensures the flow of a surge current applied to the output pad Vout into the first capacitive element C1 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electrostatic discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by means of the surge current, the thyristor rectifier circuit 110 is triggered into a thyristor mode.

Therefore, even when the number of input/output signal bits is 1, i.e. the theoretical minimum, the first capacitive element C1 connected between the higher potential line Vdd and the lower potential line Vss ensures that the thyristor rectifier circuit 110 will be triggered into a thyristor mode by a surge current induced by electro-static discharge (ESD) applied to an output pad Vout. Moreover, even when a voltage level of an input/output signal on an output pad Vout transiently exceeds a higher potential Vdd, the multistage series connection of an n number of diodes D1 inhibits a current from flowing from the output pad Vout to the higher potential line Vdd. This prevents power consumption from increasing unnecessarily.

Another modification in which an electro-static discharge protection circuit 100 is applied to protect a CMOS inverter 300 has the same effect as that described in the above modification, and will not be explained herein below.

(2) Second Embodiment

According to a second embodiment, an electro-static discharge protection circuit 100 is provided which includes a thyristor mode ensuring circuit that, independently of the number of input/output signal bits, ensures that a thyristor rectifier circuit will be triggered into a thyristor mode by a surge current induced by electro-static discharge (ESD) applied to an input/output pad PAD. To ensure that a thyristor rectifier circuit will be triggered into a thyristor mode by a surge current, the thyristor mode ensuring circuit needs to fulfill the function of keeping a snapback voltage at or under an acceptable upper limit. Hence the thyristor mode ensuring circuit both functions to ensure that a thyristor mode will be triggered, and to keep a snapback voltage at or under an acceptable upper limit.

Figure 10:
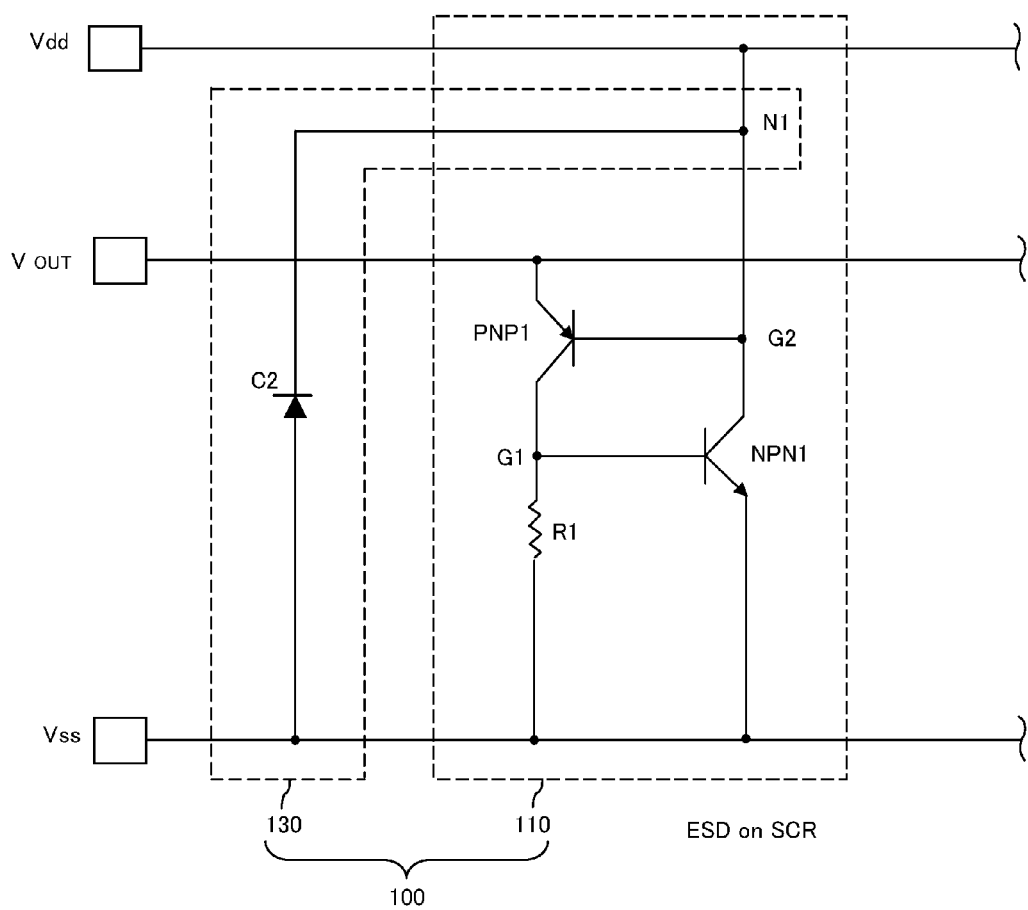
FIG. 10 is an equivalent circuit view of an electro-static discharge protection circuit of a second embodiment according to the present invention.

FIG. 10 is an equivalent circuit view to show each of the plurality of electro-static discharge protection circuits in FIG. 1. Each electro-static discharge protection circuit 100 is connected to a higher potential line Vdd which supplies a higher potential Vdd and to a lower potential line Vss which supplies a lower potential Vss. Each electro-static discharge protection circuit 100 is further connected to internal circuitry to be protected against a surge current, and to an output pad Vout which outputs output signals. Although each electro-static discharge protection circuit 100 may be connected to internal circuitry in order to be protected against a surge current and to an input pad Vin to which input signals are input, in this embodiment, the present invention will be explained by way of an example in which electro-static discharge (ESD) is applied to an output pad Vout with reference to the accompanying drawings.

The potential of an output pad Vout is higher than the lower potential Vss supplied through a lower potential supply line, and lower than the higher potential Vdd supplied through a higher potential supply line. Basically, the potential of the output pad Vout is lower than the higher potential Vdd supplied through a higher potential supply line at all times.

The electro-static discharge protection circuit 100 includes a thyristor rectifier circuit 110, and a thyristor mode ensuring circuit 130 which is electrically connected to and functionally coupled to the thyristor rectifier circuit 110.

The thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to the output pad Vout. The vertical PNP bipolar transistor PNP1 has a collector which is connected to a first terminal G1 and to the lower potential line Vss through the substrate resistance R1. The vertical PNP bipolar transistor PNP1 has a base which is connected to the higher potential line Vdd via a second terminal G2. The lateral NPN bipolar transistor NPN1 has a collector which is connected to the base of the vertical PNP bipolar transistor PNP1 via the second terminal G2 and to the higher potential line Vdd. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 130 includes a second capacitive element C2 which is connected between the higher potential line Vdd and the lower potential line Vss. The second capacitive element C2 includes a PN junction diode which is formed of a P-type single-crystal semiconductor substrate and an N-well region in the P-type single-crystal semiconductor substrate. The N region of the PN junction diode which forms the second capacitive element C2 has a first electrode which is connected to the higher potential line Vdd through the first node N1, to the base of the vertical PNP bipolar transistor PNP1, and to the collector of the lateral NPN bipolar transistor NPN1. The P region of the PN junction diode which forms the second capacitive element C2 has a second electrode which is connected to the lower potential line Vss. Unlike the above mentioned chip capacitance of stray capacitances, the capacitance provided by the second capacitive element C2 is constant independently of the number of input/output signal bits.

As described above with reference to FIG. 1, an input/output circuit 2000 is provided for each of the input/output signal bits. Each input/output circuit 2000 includes an output pad Vout, an electro-static discharge protection circuit 100 connected to the output pad Vout, and a CMOS inverter 300 connected to the electro-static discharge protection circuit 100. The CMOS inverter 300 provides an output stage of a logic circuit 1000. Between the higher potential line and the lower potential line, there exists the above mentioned chip capacitance of stray capacitances. As described above, the chip capacitance includes a stray capacitance between the higher potential line and the substrate, a stray capacitance between the lower potential line and the substrate, and a stray capacitance between the N-well regions of other electro-static discharge protection circuits 100 and the substrate. The number of the N-well regions of the other electro-static discharge protection circuits 100 depends on the number of input/output signal bits. The current flow to the chip capacitance from the electro-static discharge (ESD) applied to the input/output terminals depends on the number of input/output signal bits.

However, the electro-static discharge protection circuit 100 includes the PN junction diode which forms the second capacitive element C2 connected between the higher potential line Vdd and the lower potential line Vss other than the chip capacitance of stray capacitances. The capacitance provided by the PN junction diode which forms the second capacitive element C2 is constant independently of the number of input/output signal bits, unlike the above chip capacitance of stray capacitances. That is, since the PN junction diode which forms the second capacitive element C2 connected between the higher potential line Vdd and the lower potential line Vss ensures a constant and sufficient capacity independently of the number of input/output signal bits, even when the number of input/output signal bits is the theoretical minimum, i.e. 1, a surge current induced by electro-static discharge (ESD) applied to the output pad Vout is injected into the N region of a PN junction diode which forms the second capacitive element C2. Thus, by means of the current caused by the surge current, the thyristor rectifier circuit 110 is triggered into a thyristor mode.

When a surge current is applied to the output pad Vout, a current flows from the emitter to the base of the vertical PNP bipolar transistor PNP1. The current further flows from the base to the N region of a PN junction diode which forms the second capacitive element C2 via the second terminal G2 to charge the second capacitive element C2. This means the PN junction diode which forms the second capacitive element C2 provides a constant and sufficient capacitance independently of the number of input/output signal bits. The PN junction diode which forms the second capacitive element C2, other than the stray capacitances, consistently ensures the flow of a surge current applied to the output pad Vout into the N region of a PN junction diode of the second capacitive element C2 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electro-static discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus, as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by the surge current, the thyristor rectifier circuit 110 is triggered into a thyristor mode.

Therefore, even when the number of input/output signal bits is 1, i.e. the theoretical minimum, the PN junction diode which forms the second capacitive element C2 connected between the higher potential line Vdd and the lower potential line Vss ensures that the thyristor rectifier circuit 110 will be triggered into a thyristor mode by a surge current induced by electrostatic discharge (ESD) applied to an input/output pad PAD. This means that even when the number of input/output signal bits is 1, i.e. the theoretical minimum, the PN junction diode which forms the second capacitive element C2 connected between the higher potential line Vdd and the lower potential line Vss will keep the snapback voltage of the thyristor rectifier circuit 110 at or under an acceptable upper limit. In this way, the thyristor mode ensuring circuit 130 including the PN junction diode which forms the second capacitive element C2 connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 130 is not necessary. However, the combination of the thyristor rectifier circuit 110 and the thyristor mode ensuring circuit 130 allows the electro-static discharge protection circuit 100 to be in continuous use independently of the number of input/output signal bits.

Specifically, the thyristor mode ensuring circuit 130, which includes the PN junction diode which forms the second capacitive element C2 connected between the higher potential line Vdd and the lower potential line Vss, reliably ensures that the thyristor rectifier circuit 110 will be triggered into a thyristor mode by a surge current induced by electro-static discharge (ESD) applied to an input/output pad PAD, independently of the number of input/output signal bits.

Figure 11:
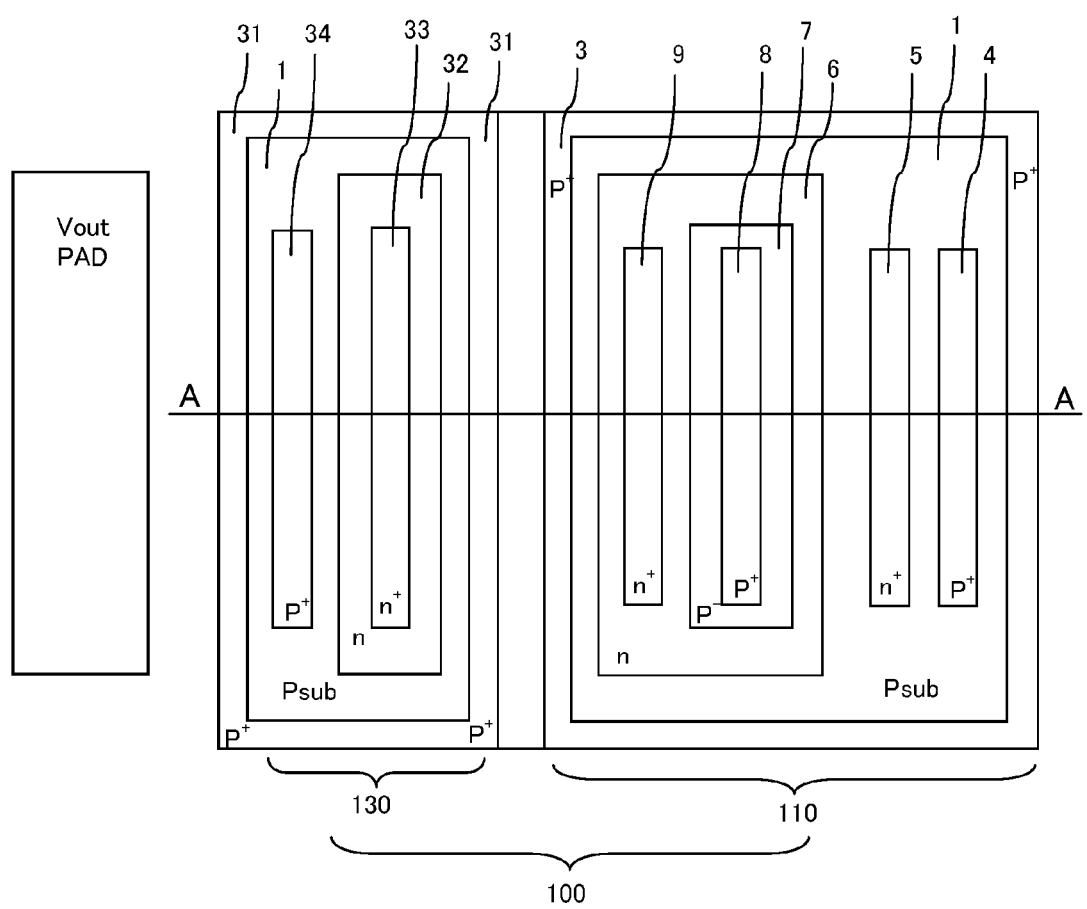
FIG. 11 is a schematic plan view of a schematic layout of the electro-static discharge protection circuit in FIG. 10 which is formed in a semiconductor substrate.
Figure 12:
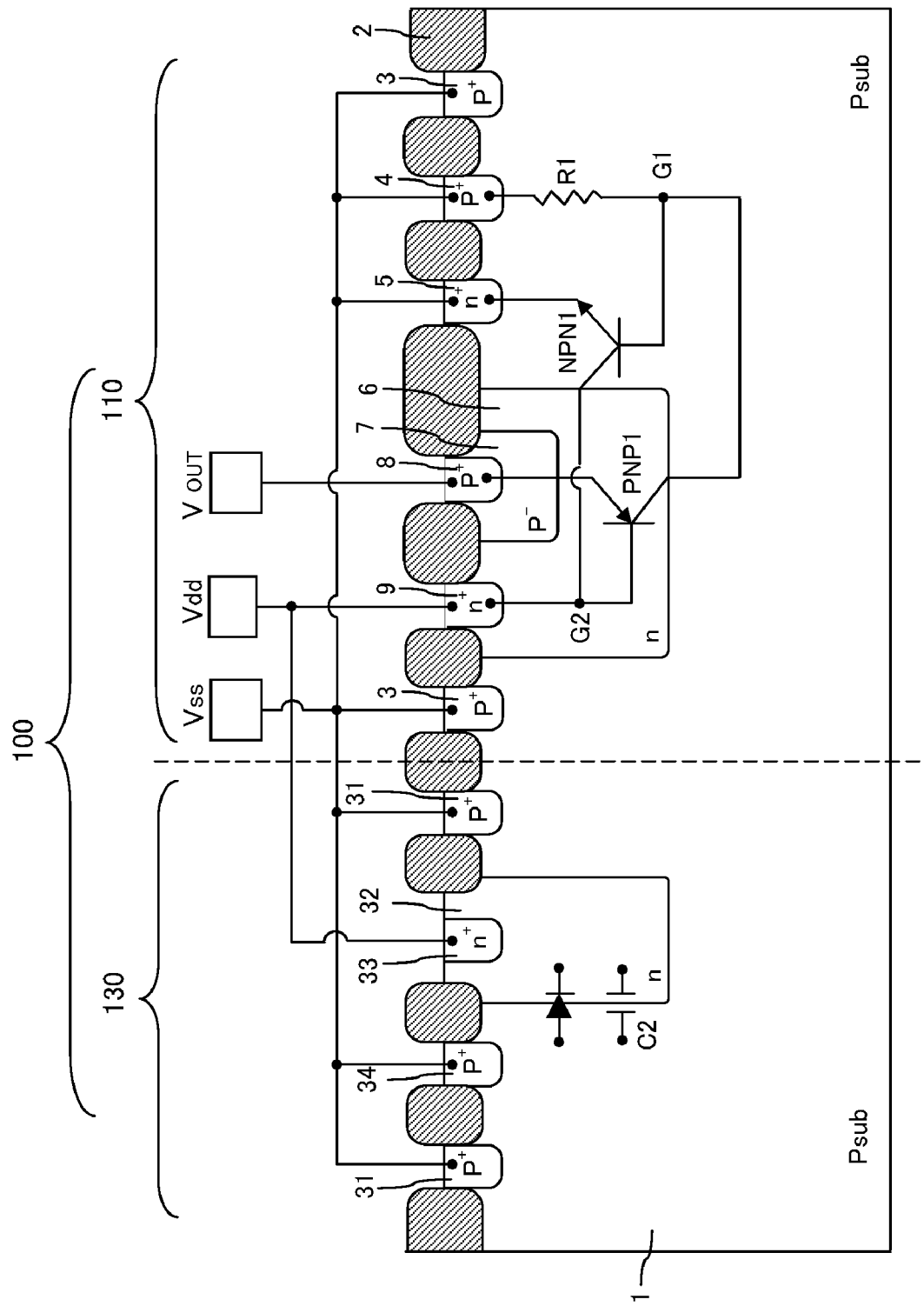
FIG. 12 is a schematic fragmentary longitudinal sectional view of a schematic layout of the electro-static discharge protection circuit taken along A-A line in FIG. 11.

The electro-static discharge protection circuit 100 shown in the above mentioned equivalent circuit view is formed in a semiconductor substrate. Now a layout of the electro-static discharge protection circuit 100 will be explained below. FIG. 11 is a schematic plan view of a schematic layout of a circuit which includes the electro-static discharge protection circuit in FIG. 10 formed in a semiconductor substrate. FIG. 12 is a schematic fragmentary longitudinal sectional view of a schematic layout of the electro-static discharge protection circuit taken along A-A line in FIG. 11.

As shown in FIG. 11 and as described above, an electro-static discharge protection circuit 100 includes a thyristor rectifier circuit 110 and a thyristor mode ensuring circuit 130. The thyristor mode ensuring circuit 130 is established between an output pad Vout and the thyristor rectifier circuit 110. The electro-static discharge protection circuit 100, and internal circuitry to be protected against a surge current by the electro-static discharge protection circuit 100, are formed in a P-type single-crystal semiconductor substrate 1. The electro-static discharge protection circuit 100 is interposed between an input/output pad PAD and the internal circuitry, and as described above, includes the thyristor rectifier circuit 110 and the thyristor mode ensuring circuit 130. The thyristor mode ensuring circuit 130 is provided between the output pad Vout and the thyristor rectifier circuit 110. The thyristor rectifier circuit 110 is provided between the thyristor mode ensuring circuit 130 and the internal circuitry.

As shown in FIG. 11 and FIG. 12, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a $P^+$ guard ring 3 in the P-type single-crystal semiconductor substrate 1, while the thyristor mode ensuring circuit 130 is formed in active regions within a region surrounded by a $P^+$ guard ring 31 in the P-type single-crystal semiconductor substrate 1.

The region to establish the thyristor rectifier circuit 110 in the P-type single-crystal semiconductor substrate 1 contains a $P^+$ impurity diffusion region 4, a $N^+$ impurity diffusion region 5 separated by a field oxide film 2 from the $P^+$ impurity diffusion region 4, and an N-well region 6 separated by a field oxide film 2 from the $N^+$ impurity diffusion region 5. The N-well region 6 further contains an $N^+$ impurity diffusion region 9, and a $P^-$ impurity diffusion region 7 separated from the $N^+$ impurity diffusion region 9. The $P^-$ impurity diffusion region 7 further contains a $P^+$ impurity diffusion region 8.

The $P^-$ impurity diffusion region 7 corresponds to the emitter of the vertical PNP bipolar transistor PNP1, the emitter being connected to the output pad Vout through the $P^+$ impurity diffusion region 8. The N-well region 6 corresponds to the base of the vertical PNP bipolar transistor PNP1, the base being connected to the higher potential line Vdd through the $N^+$ impurity diffusion region 9. The P-type single-crystal semiconductor substrate 1 corresponds to the collector of the vertical PNP bipolar transistor PNP1, the collector being connected to the lower potential line Vss through the $P^+$ impurity diffusion region 4. The P-type single-crystal semiconductor substrate 1 also corresponds to the base of the lateral NPN bipolar transistor NPN1, the base being connected to the lower potential line Vss through the $P^+$ impurity diffusion region 4. The N-well region 6 corresponds to the collector of the lateral NPN bipolar transistor NPN1, the collector being connected to the higher potential line Vdd through the $N^+$ impurity diffusion region 9. The $N^+$ impurity diffusion region 5 corresponds to the emitter of the lateral NPN bipolar transistor NPN1, the emitter being connected to the lower potential line Vss. Resistance to the current flow in the P-type single-crystal semiconductor substrate 1 corresponds to the substrate resistance R1.

The region in the P-type single-crystal semiconductor substrate 1 to establish the thyristor mode ensuring circuit 130 is provided with an N-well region 32 separated by a field oxide film 2 from a $P^+$ guard ring 31, a $P^+$ impurity diffusion region 34 separated by a field oxide film 2 from the $P^+$ guard ring 31 and the N-well region 32. The N-well region 32 is further provided with an $N^+$ impurity diffusion region 33. The N-well region 32 corresponds to the N region of a PN junction diode, and the P-type single-crystal semiconductor substrate 1 corresponds to the P region of the PN junction diode. The PN junction between the P-type single-crystal semiconductor substrate 1 and the N-well region 32 forms a second capacitive element C2. In other word, the second capacitive element C2 includes a PN junction diode. The N-well region 32 corresponds to a first electrode in the second capacitive element C2 of the PN junction diode, and is connected to the higher potential line Vdd through the N⁺ impurity diffusion region 33. The P-type single-crystal semiconductor substrate 1 corresponds to a second electrode in the second capacitive element C2 of the PN junction diode, and is connected to the lower potential line Vss through the P⁺ impurity diffusion region 34.

When a surge current is applied to the output pad Vout, a forward current flows from the P⁻ impurity diffusion region 7 which forms the emitter of the vertical PNP bipolar transistor PNP1 to the N-well region 6 which forms the base of the vertical PNP bipolar transistor PNP1 through the PN junction. The forward current further flows from the N-well region 6 which forms the base to the N-well region 32 which forms the first electrode in the PN junction diode of the second capacitive element C2, through the N⁺ impurity diffusion region 9 which forms the second terminal G2, to charge the second capacitive element C2 of the PN junction diode. This allows the second capacitive element C2 to provide a constant and sufficient capacitance independently of the number of input/output signal bits. The second capacitive element C2 of the PN junction diode, other than the stray capacitances, consistently ensures the flow of a surge current applied to the output pad Vout into the N region in the PN junction diode of the second capacitive element C2 through the emitter and the base of the vertical PNP bipolar transistor PNP1 independently of the number of input/output signal bits. As a result, the potential of the N-well region 6 which forms the base of the vertical PNP bipolar transistor PNP1 rises.

As the potential of the N-well region 6 which forms the base rises, and the potential difference between the emitter and the base of the vertical PNP bipolar transistor PNP1, namely, the difference between the potential of the N-well region 6 and the potential of the P⁻ impurity diffusion region 7, reaches a threshold voltage Vbe, the vertical PNP bipolar transistor PNP1 turns on. This turning on causes the surge current applied to the output pad Vout to flow from the P⁻ impurity diffusion region 7 which forms the emitter of the vertical PNP bipolar transistor PNP1 to the P-type single-crystal semiconductor substrate 1 which forms a collector through the N-well region 6, further to the lower potential line Vss through the substrate resistance R1 and the P⁺ impurity diffusion region 4. In other words, the collector current of the vertical PNP bipolar transistor PNP1 flows into the P-type single-crystal semiconductor substrate 1 in which the electro-static discharge protection circuit 100 is formed. This flow causes the voltage across the resistance R1 to drop, and the potential of the P-type single-crystal semiconductor substrate 1 to rise. Since the P-type single-crystal semiconductor substrate 1 forms the collector of the vertical PNP bipolar transistor PNP1 and the base of the lateral NPN bipolar transistor NPN1, the potential of the collector of the vertical PNP bipolar transistor PNP1 is equal to the potential of the base of the lateral NPN bipolar transistor NPN1. Therefore, the potential rise of the P-type single-crystal semiconductor substrate 1 corresponds to the potential rise of the base of the lateral NPN bipolar transistor NPN1.

Meanwhile, the N⁺ impurity diffusion region 5 which forms the emitter of the lateral NPN bipolar transistor NPN1 is fixed at a lower potential supplied through the lower potential line Vss. Thus as the potential of the P-type single-crystal semiconductor substrate 1 which forms the base of the lateral NPN bipolar transistor NPN1 rises, and the potential difference between the emitter and the base of the lateral NPN bipolar transistor NPN1, namely, the difference between the potential of the P-type single-crystal semiconductor substrate 1 and the potential of the N⁺ impurity diffusion region 5, reaches a threshold voltage Vbe, the lateral NPN bipolar transistor NPN1 turns on. This turning on causes the surge current to flow from the N-well region 6 which forms the collector of the lateral NPN bipolar transistor NPN1 to the N⁺ impurity diffusion region 5 which forms the emitter through the P-type single-crystal semiconductor substrate 1. In other words, by means of the surge current, the thyristor rectifier circuit 110 is triggered into a thyristor mode.

The above mentioned electro-static discharge protection circuit 100 includes the second capacitive element C2 of a PN junction diode connected between a higher potential line Vdd and a lower potential line Vss, other than a chip capacitance of stray capacitances. The capacitance provided by the second capacitive element C2 of a PN junction diode is constant independently of the number of input/output signal bits, unlike the chip capacitance of stray capacitances. Therefore, even when the number of input/output signal bits is 1, i.e. the theoretical minimum, the second capacitive element C2 of a PN junction diode connected between a higher potential line Vdd and a lower potential line Vss ensures that the thyristor rectifier circuit 110 will be triggered into a thyristor mode by a surge current induced by electro-static discharge (ESD) applied to an input/output pad PAD. This means that even when the number of input/output signal bits is 1, i.e. the theoretical minimum, the second capacitive element C2 of a PN junction diode connected between a higher potential line Vdd and a lower potential line Vss keeps the snapback voltage of the thyristor rectifier circuit 110 at or under an acceptable upper limit. In this way, the thyristor mode ensuring circuit 130 including the second capacitive element C2 of a PN junction diode connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 130 is not necessary. However, the combination of the thyristor rectifier circuit 110 and the thyristor mode ensuring circuit 130 allows the electro-static discharge protection circuit 100 to be in continuous use independently of the number of input/output signal bits.

Specifically, the thyristor mode ensuring circuit 130 which includes the second capacitive element C2 of a PN junction diode connected between a higher potential line Vdd and a lower potential line Vss reliably ensures that the thyristor rectifier circuit 110 will be triggered into a thyristor mode by a surge current induced by electro-static discharge (ESD) applied to an input/output pad PAD, independently of the number of input/output signal bits.

Modification

As described above with reference to FIG. 1, an electro-static discharge protection circuit 100 according to the second embodiment is interposed between an input/output pad PAD and internal circuitry to be protected against a surge current. The internal circuitry typically includes a logic circuit 1000. A mechanism to protect a CMOS inverter 300 against a surge current by an electro-static discharge protection circuit 100 according to the second embodiment will be explained below by way of an example in which an output pad Vout is used for an input/output pad PAD and a CMOS inverter 300 provides an output stage of the logic circuit 1000.

Figure 13:
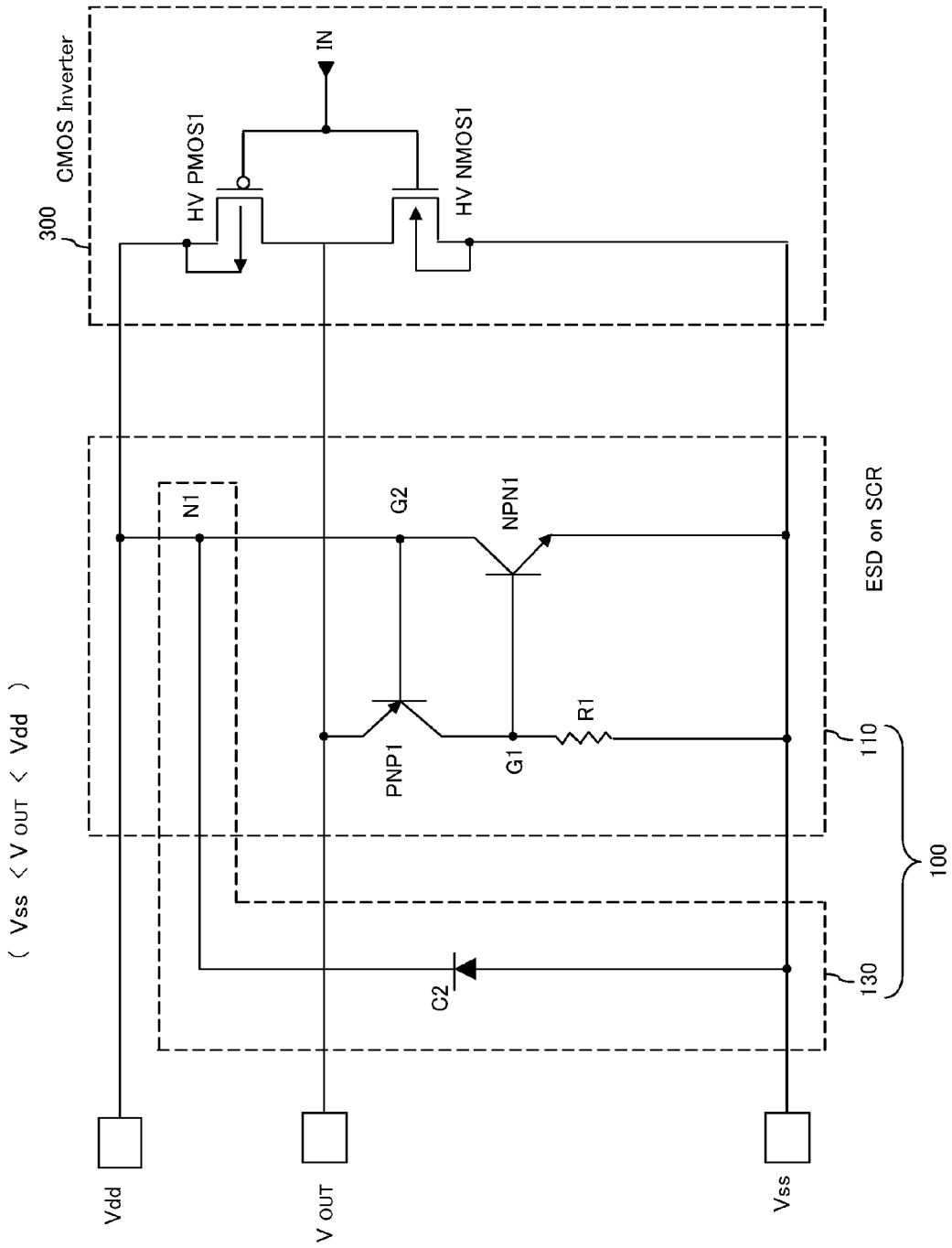
FIG. 13 is an equivalent circuit view of a circuit configuration which includes the electro-static discharge protection circuit according to the second embodiment of the present invention in FIG. 10 and a CMOS inverter to be protected against a surge current by the electro-static discharge protection circuit.
Figure 14:
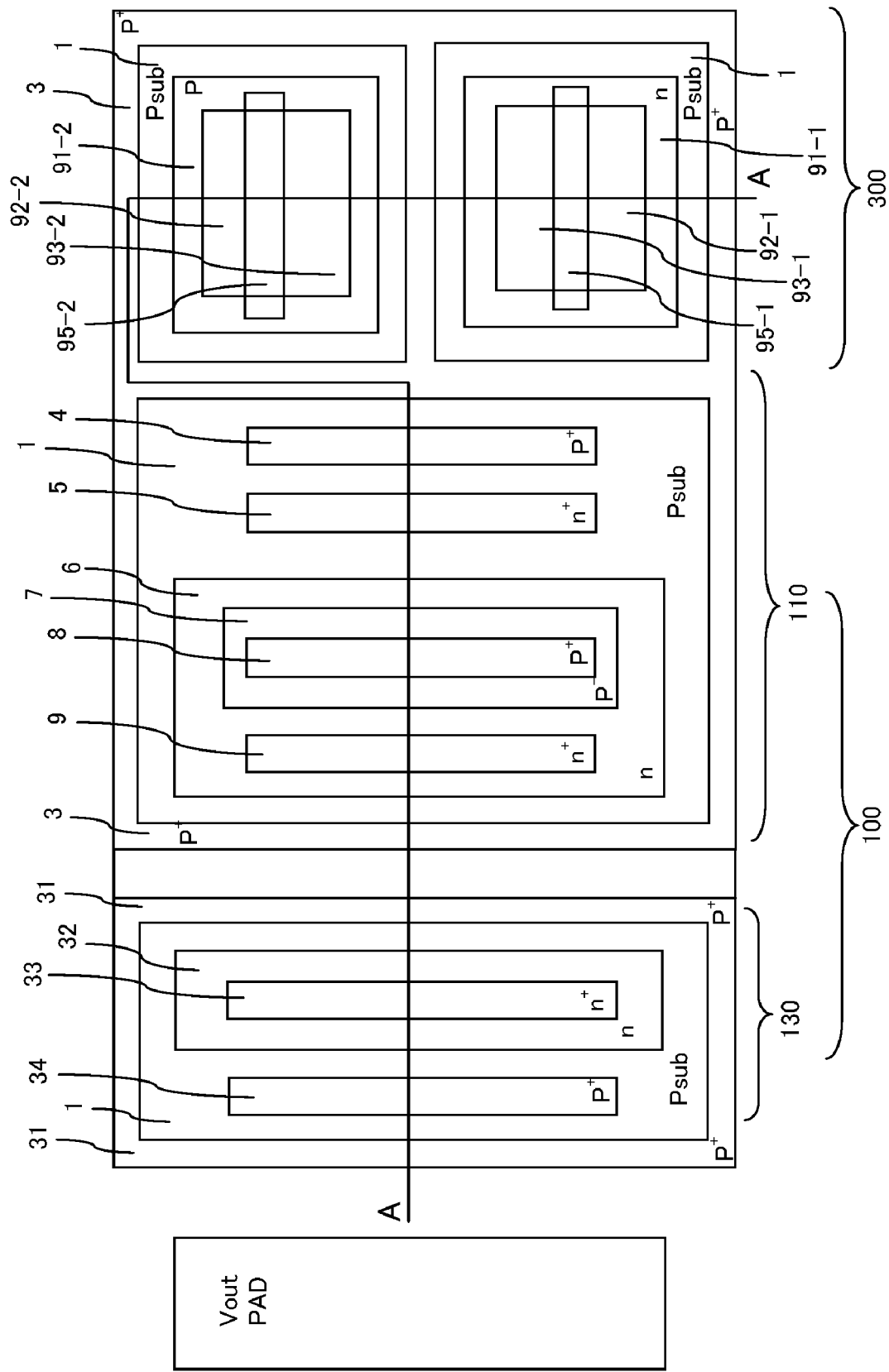
FIG. 14 is a schematic plan view of a schematic layout of a circuit which includes the electro-static discharge protection circuit according to the second embodiment of the present invention in FIG. 13 formed in a semiconductor substrate, and a CMOS inverter to be protected against a surge current by the electro-static discharge protection circuit.
Figure 15:
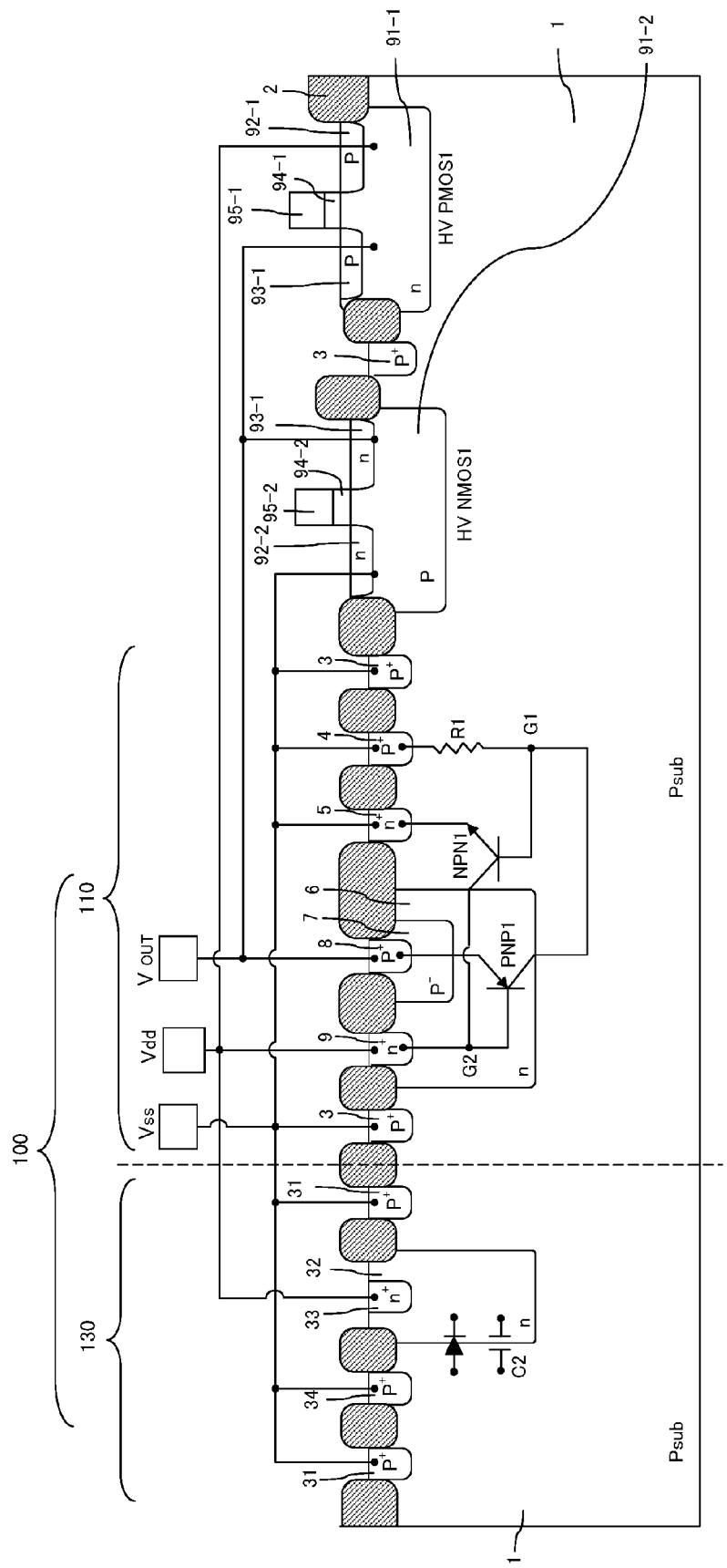
FIG. 15 is a schematic fragmentary longitudinal sectional view of a schematic layout of the electro-static discharge protection circuit according to the second embodiment of the present invention taken along A-A line in FIG. 14.

FIG. 13 is an equivalent circuit view of a circuit configuration which includes the electro-static discharge protection circuit according to the second embodiment of the present invention in FIG. 10, and a CMOS inverter to be protected against a surge current by the electro-static discharge protection circuit. FIG. 14 is a schematic plan view of a schematic layout of a circuit which includes the electro-static discharge protection circuit according to the second embodiment of the present invention in FIG. 13 formed in a semiconductor substrate, and a CMOS inverter to be protected against a surge current by the electro-static discharge protection circuit. FIG. 15 is a schematic fragmentary longitudinal sectional view of a schematic layout of the electro-static discharge protection circuit according to the second embodiment of the present invention taken along A-A line in FIG. 14.

As shown in FIG. 13, an electro-static discharge protection circuit 100 includes a thyristor rectifier circuit 110 and a thyristor mode ensuring circuit 130. The thyristor rectifier circuit 110 and the thyristor mode ensuring circuit 130 provide the same configurations, operations and effects as the described above, which will not be explained herein below. Rather, a mechanism in which the electro-static discharge protection circuit 100 protects a CMOS inverter against a surge current will be described.

A CMOS inverter 300 is connected between a higher potential line Vdd and a lower potential line Vss. The CMOS inverter 300 includes a high voltage P-channel MOS transistor HVPMOS1 and a high voltage N-channel MOS transistor HVNMOS1. The high voltage P-channel MOS transistor HVPMOS1 is connected between the higher potential line Vdd and the high voltage N-channel MOS transistor HVNMOS1, while the high voltage N-channel MOS transistor HVNMOS1 is connected between the high voltage P-channel MOS transistor HVPMOS1 and the lower potential line Vss.

The high voltage P-channel MOS transistor HVPMOS1 has a gate. To the gate, a signal which is the inversion of an output from a logic circuit 1000 is input as an input signal IN. The high voltage P-channel MOS transistor HVPMOS1 has a source which is connected to the higher potential line Vdd. The high voltage P-channel MOS transistor HVPMOS1 has a drain which is connected to an output terminal of the CMOS inverter 300, which in turn is connected to an output pad Vout. A vertical PNP bipolar transistor PNP1 in the thyristor rectifier circuit 110 has an emitter which is also connected to the output pad Vout. In this way, the drain of the high voltage P-channel MOS transistor HVPMOS1 is also connected to the emitter of the vertical PNP bipolar transistor PNP1.

The high voltage N-channel MOS transistor HVNMOS1 has a gate. To the gate, a signal which is the inversion of an output from a logic circuit 1000 is input as an input signal 1N. The high voltage N-channel MOS transistor HVNMOS1 has a source which is connected to the lower potential line Vss. The high voltage N-channel MOS transistor HVNMOS1 has a drain which is connected to an output terminal of the CMOS inverter 300, which in turn is connected to an output pad Vout. The emitter of the vertical PNP bipolar transistor PNP1 in the thyristor rectifier circuit 110 is also connected to the output pad Vout. In this way, the drain of the high voltage N-channel MOS transistor HVNMOS S1 is also connected to the emitter of the vertical PNP bipolar transistor PNP1.

As described above, when a surge current is applied to the output pad Vout, the thyristor mode ensuring circuit 130 immediately turns the thyristor rectifier circuit 110 into a thyristor mode. As a result, the surge current flows into the lower potential line Vss through the thyristor rectifier circuit 110. In other words, the thyristor mode ensuring circuit 130 immediately triggers the thyristor rectifier circuit 110 into a thyristor mode by means of the surge current applied to the output pad Vout independently of the number of input/output signal bits. This ensures that the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. By this means, the electro-static discharge protection circuit 100 reliably protects the CMOS inverter 300 against the surge current applied to the output pad Vout.

As shown in FIG. 14 and FIG. 15, the electro-static discharge protection circuit 100 and the logic circuit 1000 with the CMOS inverter 300 are provided in a P-type single-crystal semiconductor substrate 1. In other words, the electro-static discharge protection circuit 100 and the logic circuit 1000 with the CMOS inverter 300 reside in the same substrate. The electro-static discharge protection circuit 100 has the same layout as those shown in FIG. 11 and FIG. 12, which will not be explained herein below. Rather, a layout of a CMOS inverter 300 will be described.

A CMOS inverter 300 is provided between an electro-static discharge protection circuit 100 and a logic circuit 1000 in FIG. 1. As described above, the CMOS inverter 300 includes a high voltage P-channel MOS transistor HVPMOS1 and a high voltage N-channel MOS transistor HVNMOS1. An N-well region 91-1 and a P-well region 91-2 are provided respectively in active regions defined by a field oxide film 2 and surrounded by a P+ guard ring 3 in a P-type single-crystal semiconductor substrate 1. The high voltage P-channel MOS transistor HVPMOS is provided in the N-well region 91-1, and the high voltage N-channel MOS transistor HVNMOS1 is provided in the P-well region 91-2.

The high voltage P-channel MOS transistor HVPMOS1 has a source region 92-1 and a drain region 93-1, which are P-type impurity diffusion regions separated from each other in the N-well region 91-1. Between the source region 92-1 and the drain region 93-1 is defined a channel region. The high voltage P-channel MOS transistor HVPMOS1 has a gate insulator film 94-1 which is provided on the channel region, and a gate electrode 95-1 which is provided on the gate insulator film 94-1.

The high voltage N-channel MOS transistor HVNMOS1 has a source region 92-2 and a drain region 93-2, which are N-type impurity diffusion regions separated from each other in the P-well region 91-2. Between the source region 92-2 and the drain region 93-2 is defined a channel region. The high voltage N-channel MOS transistor HVNMOS1 has a gate insulator film 94-2 which is provided on the channel region, and a gate electrode 95-2 which is provided on the gate insulator film 94-2.

As described above, when a surge current is applied to an output pad Vout, the thyristor mode ensuring circuit 130 immediately turns the thyristor rectifier circuit 110 into a thyristor mode. As a result, the surge current flows into the lower potential line Vss through the thyristor rectifier circuit 110. In other words, the thyristor mode ensuring circuit 130 immediately triggers the thyristor rectifier circuit 110 into a thyristor mode by the surge current applied to the output pad Vout independently of the number of input/output signal bits. This ensures that the the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. By this means the electro-static discharge protection circuit 100 reliably protects the CMOS inverter 300 against the surge current applied to the output pad Vout.

Modification

The foregoing description is based on the assumption that the output signal voltage level on an output pad Vout from a logic circuit 1000 is constantly at or under a higher potential Vdd supplied through a higher potential line Vdd and also at or greater than a lower potential Vss supplied through a lower potential line Vss. However, the input/output signal voltage level on an input/output pad Vin/out can be transiently greater than a higher potential Vdd. To manage such a case, the circuit configuration of an electro-static discharge protection circuit 100 is preferably modified in a way explained below, so that the current should be inhibited from flowing from an output pad Vout to a higher potential line Vdd.

Figure 16:
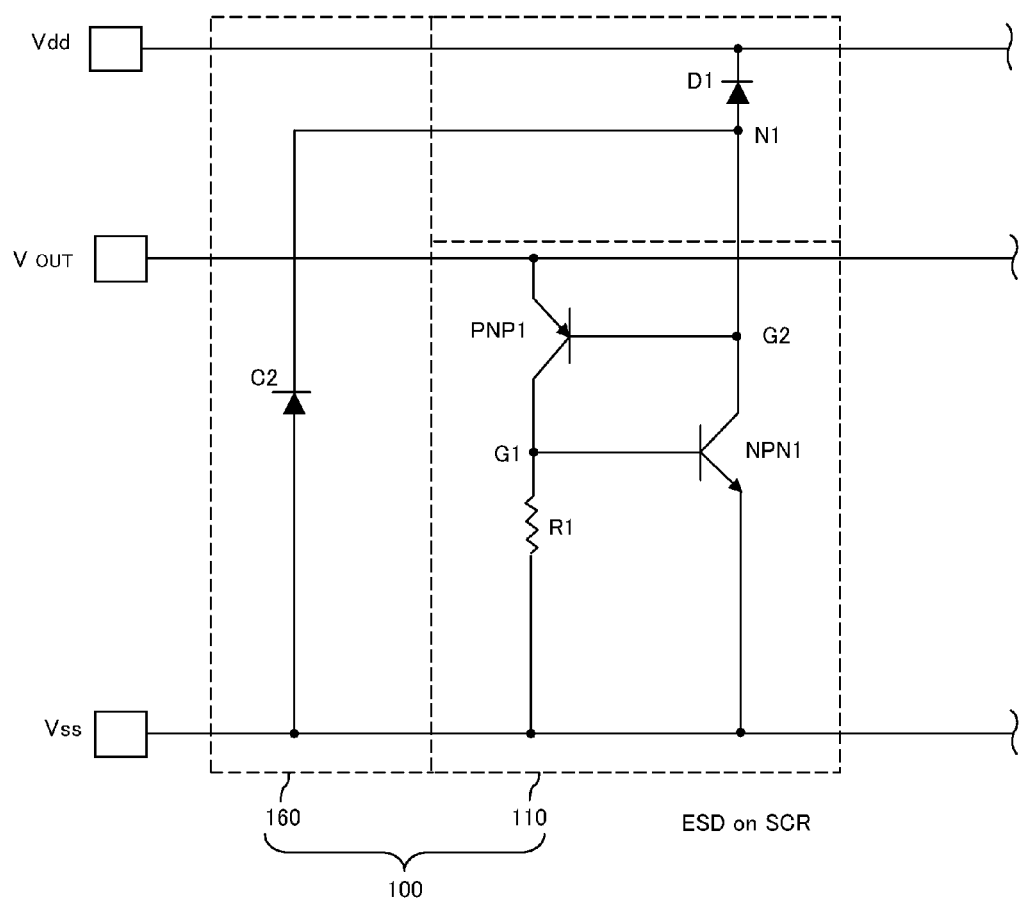
FIG. 16 is an equivalent circuit view of a modification of the electro-static discharge protection circuit according to the second embodiment of the present invention.
Figure 17:
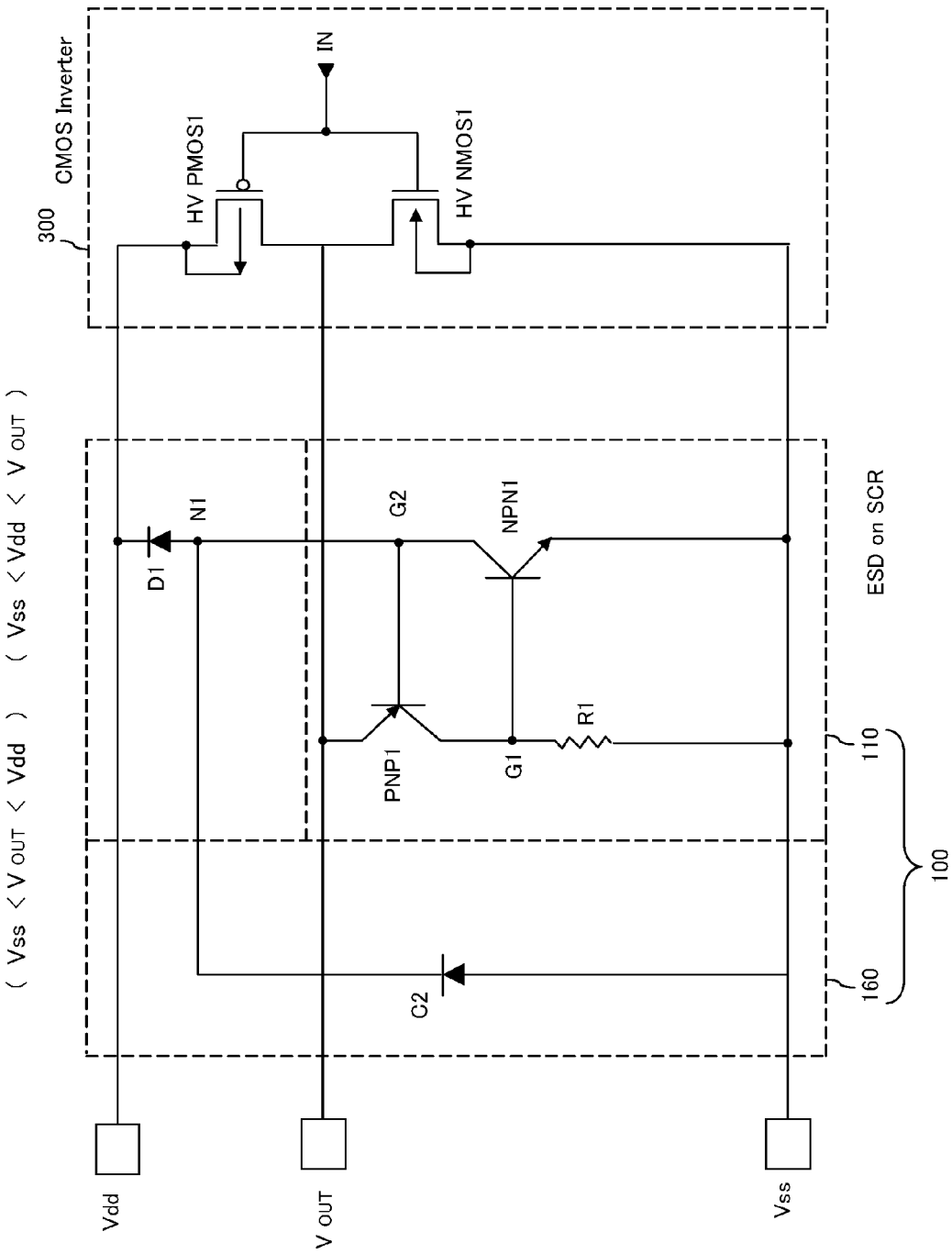
FIG. 17 is an equivalent circuit view of a circuit configuration which includes a modification of the electro-static discharge protection circuit according to the second embodiment of the present invention in FIG. 16 and a CMOS inverter to be protected against a surge current by the electro-static discharge protection circuit.

FIG. 16 is an equivalent circuit view of a modified electro-static discharge protection circuit according to the second embodiment of the present invention. FIG. 17 is an equivalent circuit view of a circuit configuration which includes a modification of the electro-static discharge protection circuit according to the second embodiment of the present invention in FIG. 16, and a CMOS inverter to be protected against a surge current by the electro-static discharge protection circuit. The electro-static discharge protection circuit 100 includes a thyristor rectifier circuit 110 and a thyristor mode ensuring circuit 160 which is electrically connected to and functionally coupled to the thyristor rectifier circuit 110.

A thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to an output pad Vout. The vertical PNP bipolar transistor PNP1 has a collector which is connected to a first terminal G1 and to a lower potential line Vss through the substrate resistance R1. The vertical PNP bipolar transistor PNP1 has a base which is connected to a first node N1 via a second terminal G2. The lateral NPN bipolar transistor NPN1 has a collector which is connected to the base of the vertical PNP bipolar transistor PNP1 via the second terminal G2 and to the first node N1. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 160 includes a second capacitive element C2 of a PN junction diode which is connected between the first node N1 and the lower potential line Vss, and a multistage series connection of a plurality of diodes D1 which are connected between the first node N1 and a higher potential line Vdd. The second capacitive element C2 of a PN junction diode has a first electrode which is connected to the higher potential line Vdd through the first node N1 and the multistage series connection of a plurality of diodes D1, to the base of the vertical PNP bipolar transistor PNP1, and to the collector of the lateral NPN bipolar transistor NPN1. The collector of the lateral NPN bipolar transistor NPN1 is connected to the higher potential line Vdd through the first node N1 and the multistage series connection of a plurality of diodes D1. Similarly, the base of the vertical PNP bipolar transistor PNP1 is connected to the higher potential line Vdd through the first node N1 and the multistage series connection of a plurality of diodes D1. The second capacitive element C2 of a PN junction diode has a second electrode which is connected to the lower potential line Vss. Unlike the above mentioned chip capacitance of stray capacitances, the capacitance provided by the second capacitive element C2 of a PN junction diode is constant, independently of the number of input/output signal bits.

The multistage series connection of a plurality of diodes D1 between the first node N1 and the higher potential line Vdd inhibits a current from flowing from an output pad Vout into the higher potential line Vdd when a voltage level of an input/output signal on an input/output pad Vin/out transiently exceeds a higher potential Vdd. Here, each of the plurality of diodes D1 is considered to have a forward voltage drop VF. And assuming that an n number of diodes D1 are connected in series, when a current flows from the output pad Vout to the higher potential line Vdd, VF×n will be the sum of the forward voltage drops across the diodes D1 due to the multistage series connection of the n number of diodes D1. Determining the n value so that the VF×n will be greater than the value of the input/output signal voltage on the input/output pad Vin/out minus the higher potential Vdd allows the multistage series connection of the n number of diodes D1 to inhibit a current from flowing from the output pad Vout to the higher potential line Vdd, even when a voltage level of an input/output signal on an input/output pad Vin/out transiently exceeds a higher potential Vdd. This prevents power consumption from increasing unnecessarily.

In addition, the multistage series connection of a plurality of diodes D1 between the first node N1 and the higher potential line Vdd does not give any adverse effect on the operation of the electrostatic discharge protection circuit 100 described above, which will be explained below.

When a surge current is applied to the output pad Vout, a current flows from the emitter to the base of the vertical PNP bipolar transistor PNP1. Due to the multistage series connection of a plurality of diodes D1 between the base of the vertical PNP bipolar transistor PNP1 and the higher potential line Vdd, the current further flows from the base to the N region of a PN junction diode of the second capacitive element C2 to charge the second capacitive element C2. This means the PN junction diode which forms the second capacitive element C2 provides a constant and sufficient capacitance independently of the number of input/output signal bits. The PN junction diode which forms the second capacitive element C2, other than the stray capacitances, consistently ensures the flow of a surge current applied to the output pad Vout into the N region of a PN junction diode of the second capacitive element C2 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electro-static discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by means of the surge current, the thyristor rectifier circuit 110 is triggered into a thyristor mode.

Therefore, even when the number of input/output signal bits is 1, i.e. the theoretical minimum, the second capacitive element C2 of the PN junction diode connected between the higher potential line Vdd and the lower potential line Vss ensures that the thyristor rectifier circuit 110 will be triggered into a thyristor mode by a surge current induced by electrostatic discharge (ESD) applied to an output pad Vout. Moreover, even when a voltage level of an input/output signal on an output pad Vout transiently exceeds a higher potential Vdd, the multistage series connection of an n number of diodes D1 inhibits a current from flowing from the output pad Vout to the higher potential line Vdd. This prevents power consumption from increasing unnecessarily.

Another modification in which an electro-static discharge protection circuit 100 is applied to protect a CMOS inverter 300 has the same effect as that described in the above modification, and will not be explained herein below.

(3) Third Embodiment

According to a third embodiment, an electro-static discharge protection circuit 100 is provided which includes a thyristor mode ensuring circuit that, independently of the number of input/output signal bits, ensures that a thyristor rectifier circuit will be triggered into a thyristor mode by a surge current induced by electro-static discharge (ESD) applied to an input/output pad PAD. To ensure that a thyristor rectifier circuit will be triggered into a thyristor mode by a surge current, the thyristor mode ensuring circuit needs to fulfill the function of keeping a snapback voltage at or under an acceptable upper limit. Hence the thyristor mode ensuring circuit both functions to ensure that a thyristor mode will be triggered, and to keep a snapback voltage at or under an acceptable upper limit.

Figure 18:
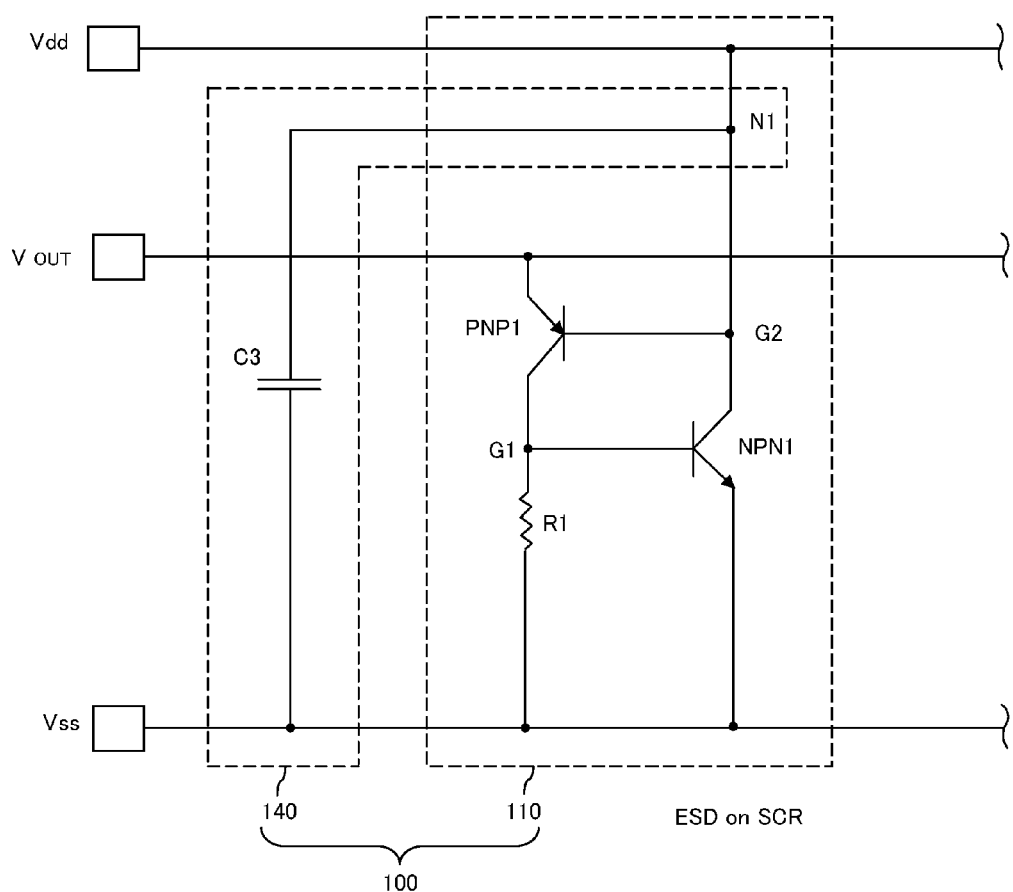
FIG. 18 is an equivalent circuit view of an electro-static discharge protection circuit according to a third embodiment of the present invention.

FIG. 18 is an equivalent circuit view which shows each of the plurality of electro-static discharge protection circuits in FIG. 1. Each electro-static discharge protection circuit 100 is connected to a higher potential line Vdd which supplies a higher potential Vdd and to a lower potential line Vss which supplies a lower potential Vss. Each electro-static discharge protection circuit 100 is further connected to internal circuitry to be protected against a surge current, and to an output pad Vout which outputs output signals. Although each electrostatic discharge protection circuit 100 may be connected to internal circuitry in order to be protected against a surge current and to an input pad Vin to which input signals are input, in this embodiment, the present invention will be explained by way of an example in which electro-static discharge (ESD) is applied to an output pad Vout with reference to the accompanying drawings.

The potential of an output pad Vout is higher than the lower potential Vss supplied through a lower potential supply line, and lower than the higher potential Vdd supplied through a higher potential supply line. Basically, the potential of the output pad Vout is lower than the higher potential Vdd supplied through a higher potential supply line at all times.

The electro-static discharge protection circuit 100 includes a thyristor rectifier circuit 110 and a thyristor mode ensuring circuit 140 which is electrically connected to and functionally coupled to the thyristor rectifier circuit 110.

The thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to an output pad Vout. The vertical PNP bipolar transistor PNP1 has a collector which is connected to a first terminal G1 and to a lower potential line Vss through the substrate resistance R1. The vertical PNP bipolar transistor PNP1 has a base which is connected to the higher potential line Vdd via a second terminal G2. The lateral NPN bipolar transistor NPN1 has a collector which is connected to the base of the vertical PNP bipolar transistor PNP1 via the second terminal G2 and to the higher potential line Vdd. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 140 includes a third capacitive element C3 which is connected between the higher potential line Vdd and the lower potential line Vss. The third capacitive element C3 has a first electrode which is connected to the higher potential line Vdd through a first node N1, to the base of the vertical PNP bipolar transistor PNP1, and to the collector of the lateral NPN bipolar transistor NPN1. The first capacitive element C3 has a second electrode which is connected to the lower potential line Vss. Unlike the above chip capacitance of stray capacitances, the capacitance provided by the first capacitive element C3 is constant independently of the number of input/output signal bits.

As described above with reference to FIG. 1, an input/output circuit 2000 is provided for each of the input/output signal bits. Each input/output circuit 2000 includes an output pad Vout, an electro-static discharge protection circuit 100 connected to the output pad Vout, and a CMOS inverter 300 connected to the electro-static discharge protection circuit 100. The CMOS inverter 300 provides an output stage of a logic circuit 1000. Between the higher potential line and the lower potential line, there exists the above mentioned chip capacitance of stray capacitances. As described above, the chip capacitance includes a stray capacitance between the higher potential line and the substrate, a stray capacitance between the lower potential line and the substrate, and a stray capacitance between the N-well regions of other electrostatic discharge protection circuits 100 and the substrate. The number of the N-well regions of the other electro-static discharge protection circuits 100 depends on the number of input/output signal bits. The current flow to the chip capacitance from the electro-static discharge (ESD) applied to the input/output terminals depends on the number of input/output signal bits.

However, the electro-static discharge protection circuit 100 includes the third capacitive element C3 connected between the higher potential line Vdd and the lower potential line Vss other than the chip capacitance of stray capacitances. The capacitance provided by the third capacitive element C3 is constant independently of the number of input/output signal bits, unlike the above chip capacitance of stray capacitances. That is, the third capacitive element C3 connected between the higher potential line Vdd and the lower potential line Vss ensures a constant and sufficient capacity independently of the number of input/output signal bits even when the number of input/output signal bits is the theoretical minimum, i.e. 1, so that a surge current induced by electro-static discharge (ESD) applied to the output pad Vout is injected into the third capacitive element C3 to charge it. Thus, by means of the current caused by the surge current, the thyristor rectifier circuit 110 is triggered into a thyristor mode.

When a surge current is applied to the output pad Vout, a current flows from the emitter to the base of the vertical PNP bipolar transistor PNP1. The current flows from the base to the third capacitive element C3 via the second terminal G2 to charge the third capacitive element C3. This means the third capacitive element C3 provides a constant and sufficient capacitance independently of the number of input/output signal bits. The third capacitive element C3, other than the stray capacitances, ensures the flow of a surge current applied to the output pad Vout into the third capacitive element C3 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electrostatic discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus, as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by the surge current, the thyristor rectifier circuit 110 is triggered into a thyristor mode.

Therefore, even when the number of input/output signal bits is 1, i.e. the theoretical minimum, the third capacitive element C3 connected between the higher potential line Vdd and the lower potential line Vss ensures that the thyristor rectifier circuit 110 will be triggered into a thyristor mode by a surge current induced by electro-static discharge (ESD) applied to an input/output pad PAD. This means that even when the number of input/output signal bits is 1, i.e. the theoretical minimum, the third capacitive element C3 connected between the higher potential line Vdd and the lower potential line Vss will keep the snapback voltage of the thyristor rectifier circuit 110 at or under an acceptable upper limit. In this way, the thyristor mode ensuring circuit 140 including the third capacitive element C3 connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 140 is not necessary. However, the combination of the thyristor rectifier circuit 110 and the thyristor mode ensuring circuit 140 allows the electro-static discharge protection circuit 100 to be in continuous use independently of the number of input/output signal bits.

The thyristor mode ensuring circuit 140, which includes the third capacitive element C3 connected between the higher potential line Vdd and the lower potential line Vss, reliably ensures that the thyristor rectifier circuit 110 will be triggered into a thyristor mode by a surge current induced by electro-static discharge (ESD) applied to an input/output pad PAD, independently of the number of input/output signal bits.

Figure 19:
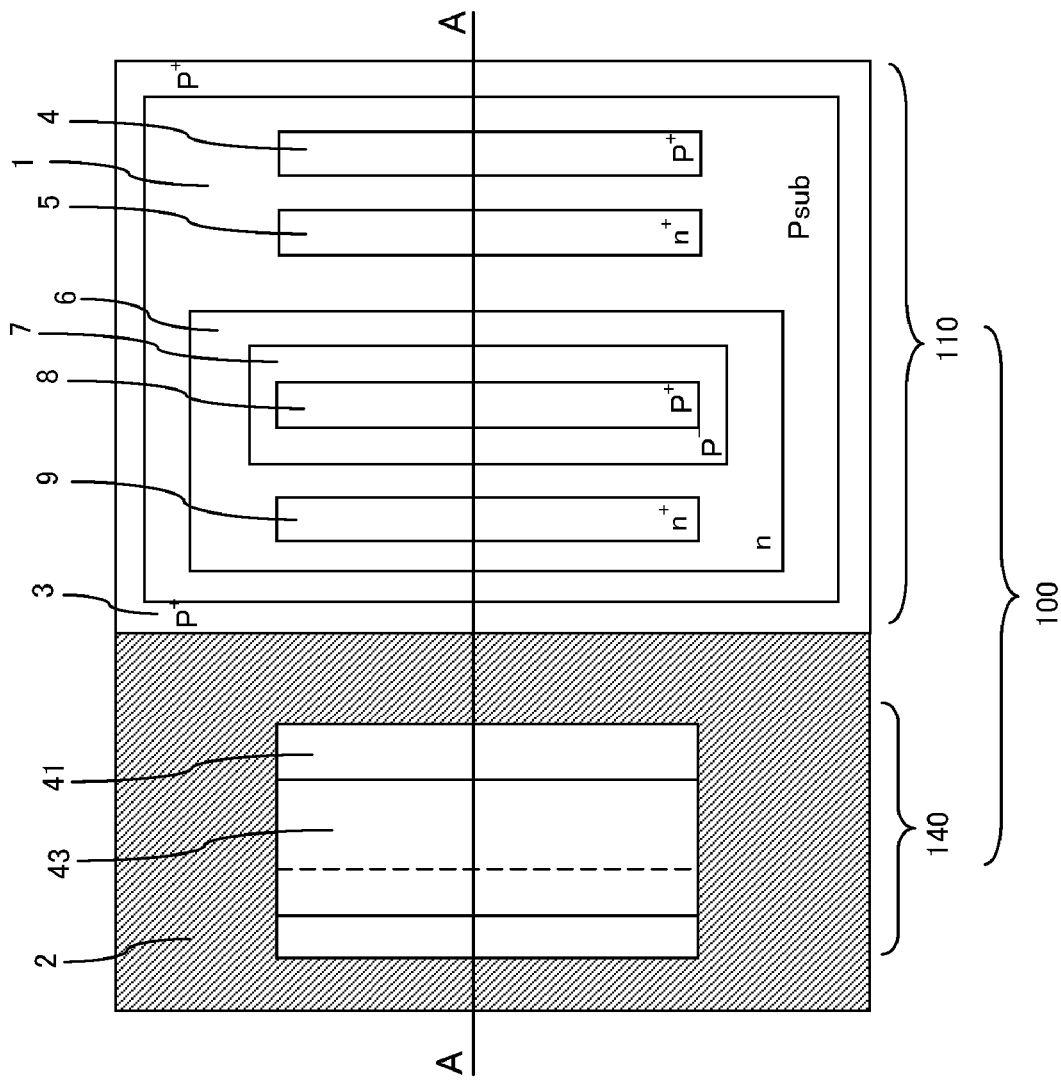
FIG. 19 is a schematic plan view of a schematic layout of the electro-static discharge protection circuit in FIG. 18 which is formed in a semiconductor substrate.
Figure 20:
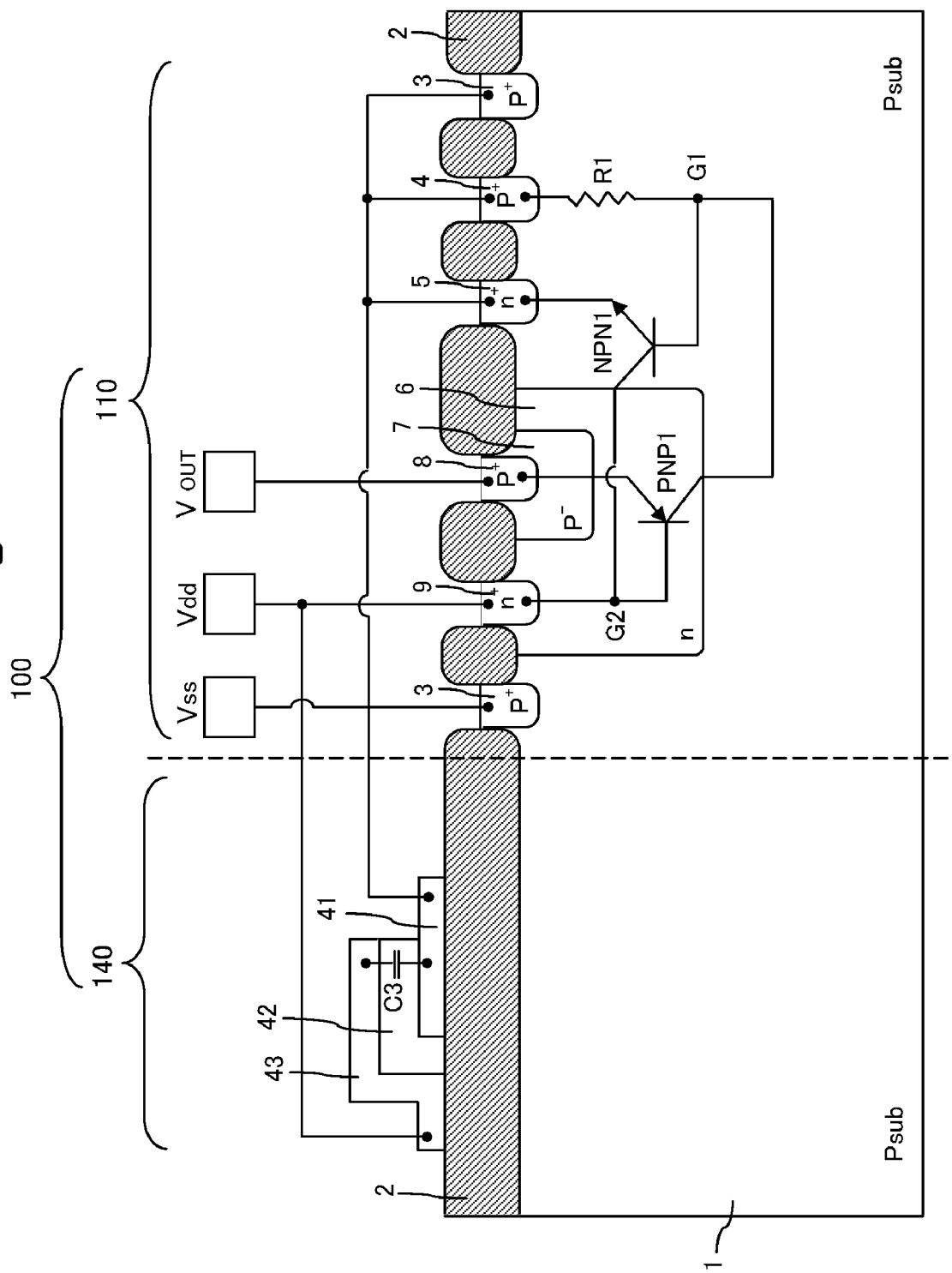
FIG. 20 is a schematic fragmentary longitudinal sectional view of a schematic layout of the electro-static discharge protection circuit taken along A-A line in FIG. 19.

The electro-static discharge protection circuit 100 shown in the above mentioned equivalent circuit view is formed in a semiconductor substrate. Now a layout of the electro-static discharge protection circuit 100 will be explained below. FIG. 19 is a schematic plan view of a schematic layout of the electro-static discharge protection circuit in FIG. 18 which is formed in a semiconductor substrate. FIG. 20 is a schematic sectional fragmentary longitudinal view of a schematic layout of the electro-static discharge protection circuit taken along A-A line in FIG. 19.

As shown in FIG. 19 and as described above, an electro-static discharge protection circuit 100 includes a thyristor rectifier circuit 110 and a thyristor mode ensuring circuit 140. The thyristor mode ensuring circuit 140 is established between an output pad Vout and the thyristor rectifier circuit 110. In a P-type single-crystal semiconductor substrate 1, the electro-static discharge protection circuit 100 and an internal circuitry to be protected against a surge current by the electro-static discharge protection circuit 100 are formed. The electro-static discharge protection circuit 100 is interposed between an input/output pad PAD and the internal circuitry, and as described above, includes the thyristor rectifier circuit 110 and the thyristor mode ensuring circuit 140. The thyristor mode ensuring circuit 140 is provided between the output pad Vout and the thyristor rectifier circuit 110. The thyristor rectifier circuit 110 is provided between the thyristor mode ensuring circuit 140 and the internal circuitry.

As shown in FIG. 19 and FIG. 20, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a P$^+$ guard ring 3 in the P-type single-crystal semiconductor substrate 1, while the thyristor mode ensuring circuit 140 is formed in active regions within a region surrounded by a P$^+$ guard ring 21 in the P-type single-crystal semiconductor substrate 1.

The region to establish the thyristor rectifier circuit 110 in the P-type single-crystal semiconductor substrate 1 contains a P$^+$ impurity diffusion region 4, a N$^+$ impurity diffusion region 5 separated by a field oxide film 2 from the P$^+$ impurity diffusion region 4, and an N-well region 6 separated by a field oxide film 2 from the N$^+$ impurity diffusion region 5. The N-well region 6 further contains an N$^+$ impurity diffusion region 9, and a P$^-$ impurity diffusion region 7 separated from the N$^+$ impurity diffusion region 9. The P$^-$ impurity diffusion region 7 further contains a P$^+$ impurity diffusion region 8.

The P$^-$ impurity diffusion region 7 corresponds to the emitter of the vertical PNP bipolar transistor PNP1, the emitter being connected to the output pad Vout through the P$^+$ impurity diffusion region 8. The N-well region 6 corresponds to the base of the vertical PNP bipolar transistor PNP1, the base being connected to the higher potential line Vdd through the N$^+$ impurity diffusion region 9. The P-type single-crystal semiconductor substrate 1 corresponds to the collector of the vertical PNP bipolar transistor PNP1, the collector being connected to the lower potential line Vss through the P$^+$ impurity diffusion region 4. The P-type single-crystal semiconductor substrate 1 also corresponds to the base of the lateral NPN bipolar transistor NPN1, the base being connected to the lower potential line Vss through the P$^+$ impurity diffusion region 4. The N-well region 6 corresponds to the collector of the lateral NPN bipolar transistor NPN1, the collector being connected to the higher potential line Vdd through the N$^+$ impurity diffusion region 9. The N$^+$ impurity diffusion region 5 corresponds to the emitter of the lateral NPN bipolar transistor NPN1, the emitter being connected to the lower potential line Vss. Resistance to the current flow in the P-type single-crystal semiconductor substrate 1 corresponds to the substrate resistance R1.

The region to establish the thyristor mode ensuring circuit 140 is provided with a first polysilicon electrode 41 extending over a field oxide film 2, a first dielectric film 42 extending over the first polysilicon electrode 41 and one side of the electrode 41, and a second polysilicon electrode 43 extending over the first polysilicon electrode 41 and a field oxide film 2. The first polysilicon electrode 41, the first dielectric film 42, and the second polysilicon electrode 43 form the third capacitive element C3. That is, the third capacitive element C3 includes a polysilicon electrode capacitor. The second polysilicon electrode 43 corresponds to the first electrode of the third capacitive element C3, and is connected to the higher potential line Vdd. The first polysilicon electrode 41 corresponds to the second electrode of the third capacitive element C3, and is connected to the lower potential line Vss.

When a surge current is applied to the output pad Vout, a forward current flows from the P$^-$ impurity diffusion region 7 which forms the emitter of the vertical PNP bipolar transistor PNP1 to the N-well region 6 which forms the base of the vertical PNP bipolar transistor PNP1 through the PN junction. The forward current further flows from the N-well region 6 which forms the base to the second polysilicon electrode 43 which forms the first electrode of the third capacitive element C3, through the N$^+$ impurity diffusion region 9 which forms second terminal G2, to charge the third capacitive element C3 of the first polysilicon electrode 41, the first dielectric film 42, and the second polysilicon electrode 43. This allows the third capacitive element C3 to provide a constant and sufficient capacitance independently of the number of input/output signal bits. The third capacitive element C3, other than the stray capacitances, consistently ensures the flow of a surge current applied to the output pad Vout into the third capacitive element C3 through the emitter and the base of the vertical PNP bipolar transistor PNP1 independently of the number of input/output signal bits. As a result, the potential of the N-well region 6 which forms the base of the vertical PNP bipolar transistor PNP1 rises.

As the potential of the N-well region 6 which forms the base rises, and the potential difference between the emitter and the base of the vertical PNP bipolar transistor PNP1, namely, the difference between the potential of the N-well region 6 and the potential of the P$^-$ impurity diffusion region 7, reaches a threshold voltage Vbe, the vertical PNP bipolar transistor PNP1 turns on. This turning on causes the surge current applied to the output pad Vout to flow from the P$^-$ impurity diffusion region 7 which forms the emitter of the vertical PNP bipolar transistor PNP1 to the P-type single-crystal semiconductor substrate 1 which forms the collector through the N-well region 6, further to the lower potential line Vss through the substrate resistance R1 and the P$^+$ impurity diffusion region 4. In other words, the collector current of the vertical PNP bipolar transistor PNP1 flows into the P-type single-crystal semiconductor substrate 1 in which the electro-static discharge protection circuit 100 is formed. This flow causes the voltage across the resistance R1 to drop, and the potential of the P-type single-crystal semiconductor substrate 1 to rise. Since the P-type single-crystal semiconductor substrate 1 forms the collector of the vertical PNP bipolar transistor PNP1 and the base of the lateral NPN bipolar transistor NPN1, the potential of the collector of the vertical PNP bipolar transistor PNP1 is equal to the potential of the base of the lateral NPN bipolar transistor NPN1. Therefore, the potential rise of the P-type single-crystal semiconductor substrate 1 corresponds to the potential rise of the base of the lateral NPN bipolar transistor NPN1.

Meanwhile, the N$^+$ impurity diffusion region 5 which forms the emitter of the lateral NPN bipolar transistor NPN1 is fixed at a lower potential supplied through the lower potential line Vss. Thus as the potential of the P-type single-crystal semiconductor substrate 1 which forms the base of the lateral NPN bipolar transistor NPN1 rises, and the potential difference between the emitter and the base of the lateral NPN bipolar transistor NPN1, namely, the difference between the potential of the P-type single-crystal semiconductor substrate 1 and the potential of the N$^+$ impurity diffusion region 5, reaches a threshold voltage Vbe, the lateral NPN bipolar transistor NPN1 turns on. This turning on causes the surge current to flow from the N-well region 6 which forms the collector of the lateral NPN bipolar transistor NPN1 to the N$^+$ impurity diffusion region 5 which forms the emitter through the P-type single-crystal semiconductor substrate 1. In other words, by means of the surge current, the thyristor rectifier circuit 110 is triggered into a thyristor mode.

The above mentioned electro-static discharge protection circuit 100 includes a third capacitive element C3 connected between a higher potential line Vdd and a lower potential line Vss, other than a chip capacitance of stray capacitances. The capacitance provided by the third capacitive element C3 is constant independently of the number of input/output signal bits, unlike the chip capacitance of stray capacitances. Therefore, even when the number of input/output signal bits is 1, i.e. the theoretical minimum, the third capacitive element C3 connected between a higher potential line Vdd and a lower potential line Vss ensures to make the thyristor rectifier circuit 110 to be triggered into a thyristor mode by a surge current induced by electro-static discharge (ESD) applied to an input/output pad PAD. This means, even when the number of input/output signal bits is 1, i.e. the theoretical minimum, the third capacitive element C3 connected between a higher potential line Vdd and a lower potential line Vss keeps the snapback voltage of the thyristor rectifier circuit 110 at or under an acceptable upper limit. In this way, the thyristor mode ensuring circuit 140 including the third capacitive element C3 connected between the higher potential line Vdd and the lower potential line Vss constantly keeps the snapback voltage of the thyristor rectifier circuit 110 at or under an acceptable upper limit independently of the number of input/output signal bits.

Of course, when the number of input/output signal bits is very large, the thyristor mode ensuring circuit 140 is not necessary. However, the combination of the thyristor rectifier circuit 110 and the thyristor mode ensuring circuit 140 allows the electro-static discharge protection circuit 100 to be in a continuous use independently of the number of input/output signal bits.

Specifically, the thyristor mode ensuring circuit 140 which includes the third capacitive element C3 connected between the higher potential line Vdd and the lower potential line Vss reliably ensures that the thyristor rectifier circuit 110 will be triggered into a thyristor mode by a surge current induced by electro-static discharge (ESD) applied to an input/output pad PAD, independently of the number of input/output signal bits.

Modification

As described above with reference to FIG. 1, an electro-static discharge protection circuit 100 according to the third embodiment is interposed between an input/output pad PAD and internal circuitry to be protected against a surge current. The internal circuitry typically includes a logic circuit 1000. A mechanism to protect a CMOS inverter 300 against a surge current by an electro-static discharge protection circuit 100 according to the third embodiment will be explained below by way of an example in which an output pad Vout is used for an input/output pad PAD and a CMOS inverter 300 provides an output stage of the logic circuit 1000.

Figure 21:
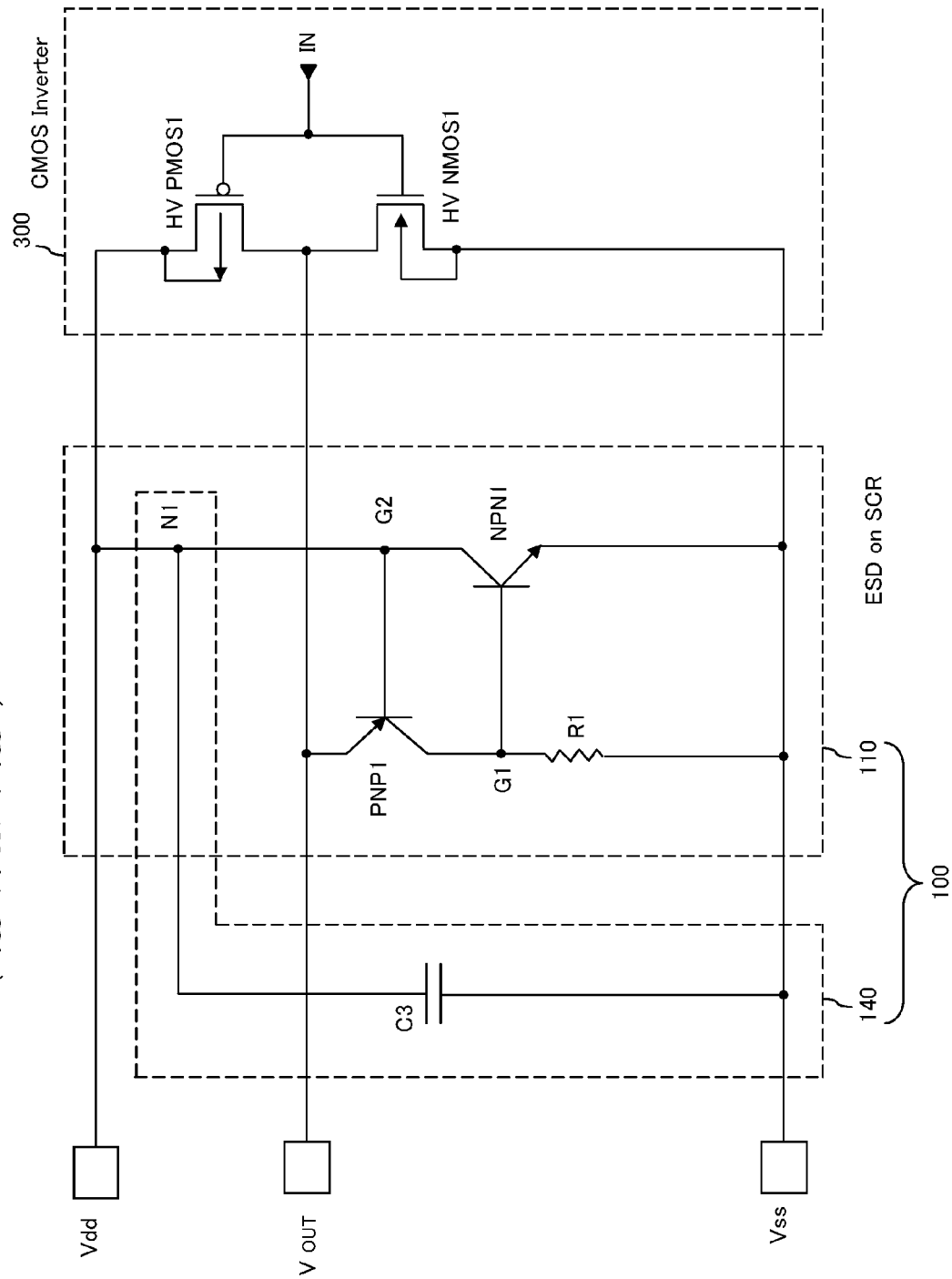
FIG. 21 is an equivalent circuit view of a circuit configuration which includes the electro-static discharge protection circuit according to the third embodiment of the present invention in FIG. 18 and a CMOS inverter to be protected against a surge current by the electro-static discharge protection circuit.
Figure 22:
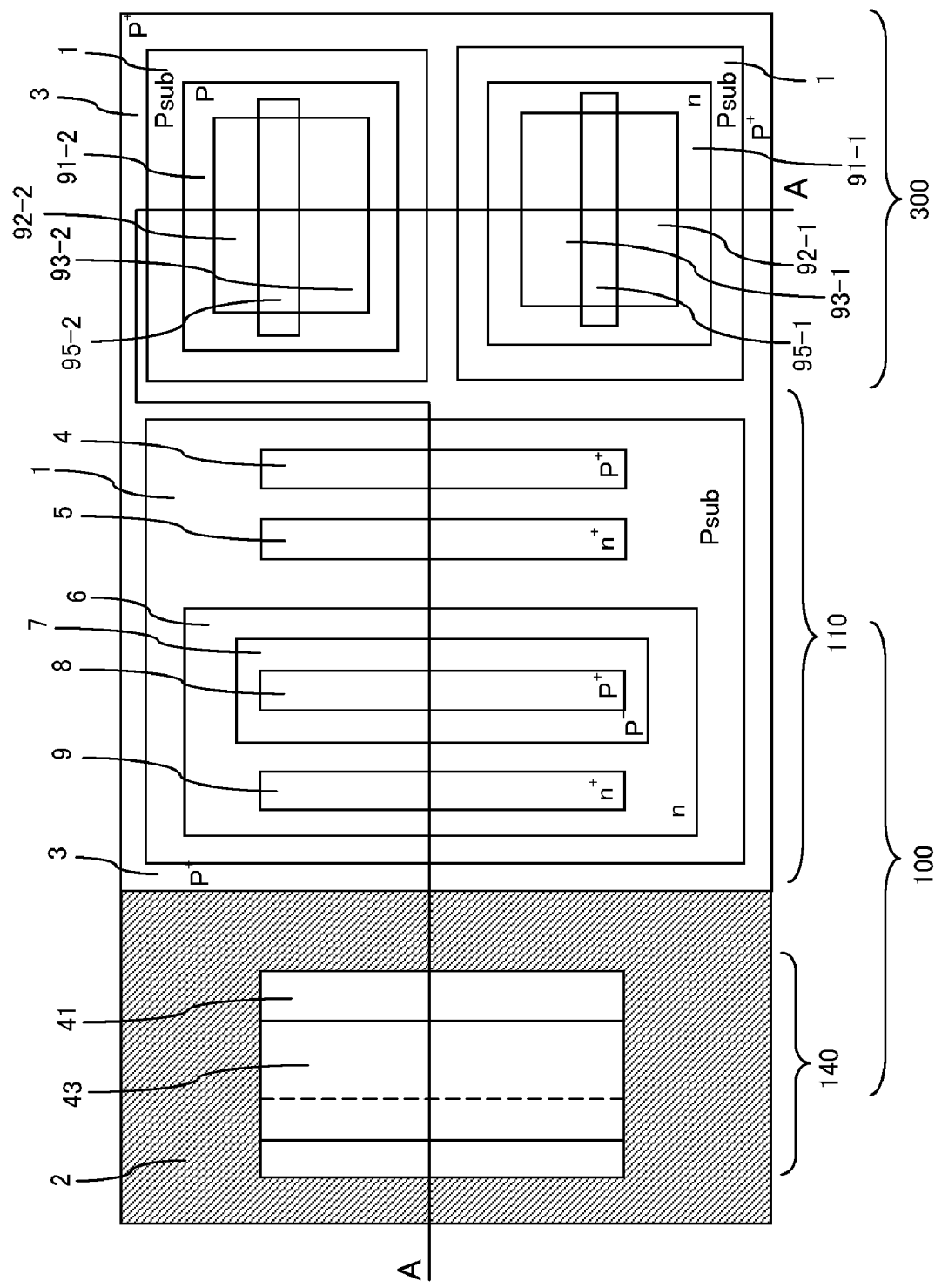
FIG. 22 is a schematic plan view of a schematic layout of a circuit which includes the electro-static discharge protection circuit according to the third embodiment of the present invention in FIG. 21 formed in a semiconductor substrate, and a CMOS inverter to be protected against a surge current by the electro-static discharge protection circuit.
Figure 23:
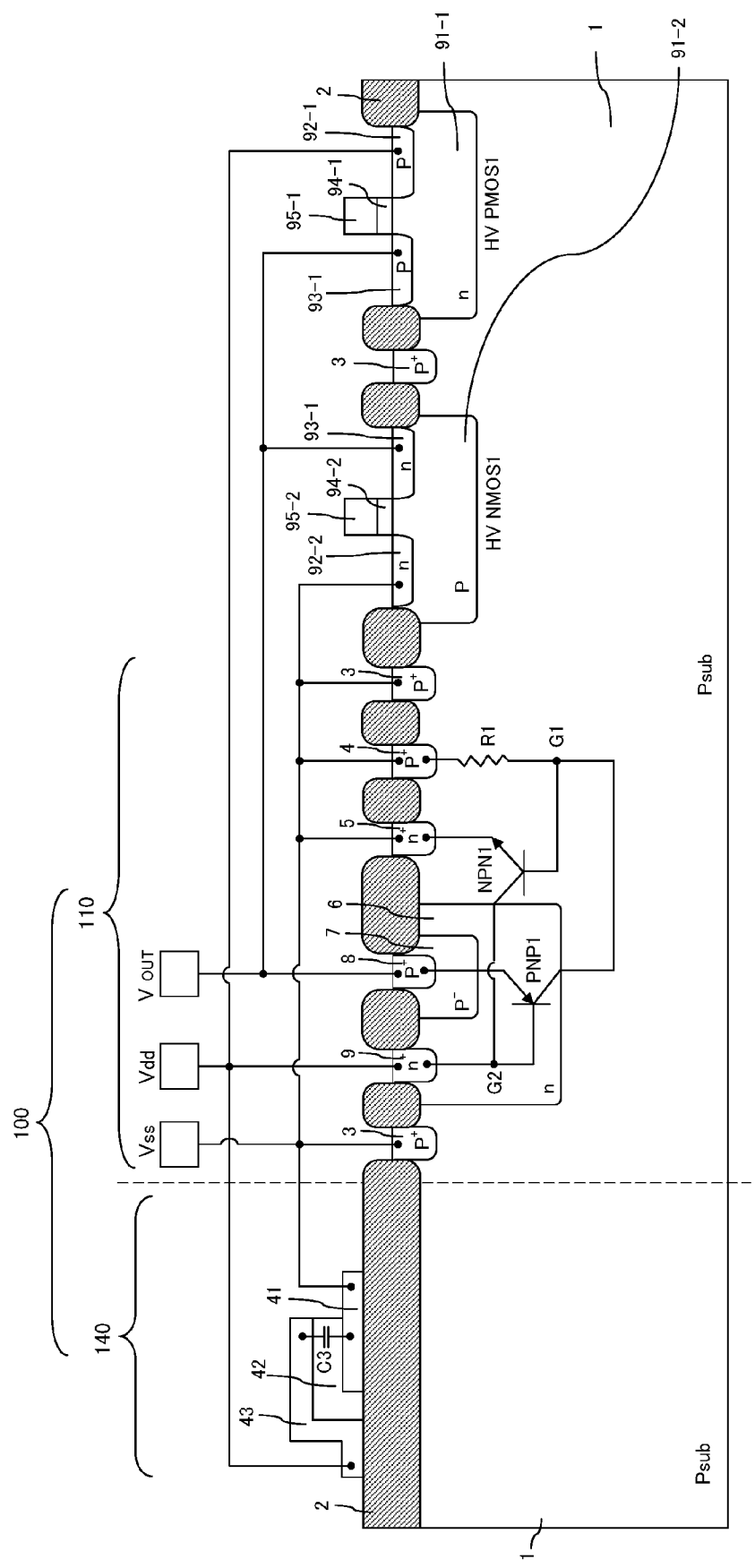
FIG. 23 is a schematic fragmentary longitudinal sectional view of a schematic layout of the electro-static discharge protection circuit according to the third embodiment of the present invention taken along A-A line in FIG. 22.

FIG. 21 is an equivalent circuit view of a circuit configuration which includes the electro-static discharge protection circuit according to the third embodiment of the present invention in FIG. 18 and a CMOS inverter to be protected against a surge current by the electro-static discharge protection circuit. FIG. 22 is a schematic plan view of a schematic layout of a circuit which includes the electro-static discharge protection circuit of FIG. 21 of the third embodiment according to the present invention formed in a semiconductor substrate, and a CMOS inverter to be protected against a surge current by the electro-static discharge protection circuit. FIG. 23 is a schematic fragmentary longitudinal sectional view of a schematic layout of the electro-static discharge protection circuit of the third embodiment according to the present invention taken along the A-A line in FIG. 22.

As shown in FIG. 21, an electro-static discharge protection circuit 100 includes a thyristor rectifier circuit 110 and a thyristor mode ensuring circuit 140. The thyristor rectifier circuit 110 and the thyristor mode ensuring circuit 140 provide the same configurations, operations and effects as the described above, which will not be explained herein below. Rather, a mechanism in which the electro-static discharge protection circuit 100 protects a CMOS inverter against a surge current will be described.

A CMOS inverter 300 is connected between a higher potential line Vdd and a lower potential line Vss. The CMOS inverter 300 includes a high voltage P-channel MOS transistor HVPMOS1 and a high voltage N-channel MOS transistor HVNMOS1. The high voltage P-channel MOS transistor HVPMOS1 is connected between a higher potential line Vdd and the high voltage N-channel MOS transistor HVNMOS1, while the high voltage N-channel MOS transistor HVNMOS1 is connected between the high voltage P-channel MOS transistor HVPMOS1 and a lower potential line Vss.

The high voltage P-channel MOS transistor HVPMOS has a gate. To the gate, a signal which is the inversion of an output from a logic circuit 1000 is input as an input signal IN. The high voltage P-channel MOS transistor HVPMOS1 has a source which is connected to the higher potential line Vdd. The high voltage P-channel MOS transistor HVPMOS1 has a drain which is connected to an output terminal of the CMOS inverter 300, which in turn is connected to an output pad Vout. A vertical PNP bipolar transistor PNP1 in the thyristor rectifier circuit 110 has an emitter which is also connected to the output pad Vout. In this way, the drain of the high voltage P-channel MOS transistor HVPMOS1 is also connected to the emitter of the vertical PNP bipolar transistor PNP1.

The high voltage N-channel MOS transistor HVNMOS1 has a gate. To the gate, a signal which is the inversion of an output from a logic circuit 1000 is input as an input signal IN. The high voltage N-channel MOS transistor HVNMOS1 has a source which is connected to the lower potential line Vss. The high voltage N-channel MOS transistor HVNMOS1 has a drain which is connected to an output terminal of the CMOS inverter 300, which in turn is connected to an output pad Vout. The emitter of the vertical PNP bipolar transistor PNP1 in the thyristor rectifier circuit 110 is also connected to the output pad Vout. In this way, the drain of the high voltage N-channel MOS transistor HVNMOS S1 is also connected to the emitter of the vertical PNP bipolar transistor PNP1.

As described above, when a surge current is applied to the output pad Vout, the thyristor mode ensuring circuit 140 immediately turns the thyristor rectifier circuit 110 into a thyristor mode. As a result, the surge current flows into the lower potential line Vss through the thyristor rectifier circuit 110. In other words, the thyristor mode ensuring circuit 140 immediately triggers the thyristor rectifier circuit 110 into a thyristor mode by means of the surge current applied to the output pad Vout independently of the number of input/output signal bits. This ensures that the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. By this means, the electro-static discharge protection circuit 100 reliably protects the CMOS inverter 300 against the surge current applied to the output pad Vout.

As shown in FIG. 22 and FIG. 23, the electro-static discharge protection circuit 100 and the logic circuit 1000 with the CMOS inverter 300 are provided in a P-type single-crystal semiconductor substrate 1. In other words, the electro-static discharge protection circuit 100 and the logic circuit 1000 with the CMOS inverter 300 reside in the same substrate. The electro-static discharge protection circuit 100 has the same layout as those shown in FIG. 19 and FIG. 20, which will not be explained herein below. Rather, a layout of a CMOS inverter 300 will be described.

A CMOS inverter 300 is provided between an electro-static discharge protection circuit 100 and a logic circuit 1000 in FIG. 1. As described above, the CMOS inverter 300 includes a high voltage P-channel MOS transistor HVPMOS1 and a high voltage N-channel MOS transistor HVNMOS1. An N-well region 91-1 and a P-well region 91-2 are provided respectively in active regions defined by a field oxide film 2 and surrounded by a P+ guard ring 3 in a P-type single-crystal semiconductor substrate 1. The high voltage P-channel MOS transistor HVPMOS is provided in the N-well region 91-1, and the high voltage N-channel MOS transistor HVNMOS1 is provided in the P-well region 91-2.

The high voltage P-channel MOS transistor HVPMOS1 has a source region 92-1 and a drain region 93-1, which are P-type impurity diffusion regions separated from each other in the N-well region 91-1. Between the source region 92-1 and the drain region 93-1 is defined a channel region. The high voltage P-channel MOS transistor HVPMOS1 has a gate insulator film 94-1 which is provided on the channel region, and a gate electrode 95-1 which is provided on the gate insulator film 94-1.

The high voltage N-channel MOS transistor HVNMOS1 has a source region 92-2 and a drain region 93-2, which are N-type impurity diffusion regions separated from each other in the P-well region 91-2. Between the source region 92-2 and the drain region 93-2 is defined a channel region. The high voltage N-channel MOS transistor HVNMOS1 has a gate insulator film 94-2 which is provided on the channel region, and a gate electrode 95-2 which is provided on the gate insulator film 94-2.

As described above, when a surge current is applied to an output pad Vout, the thyristor mode ensuring circuit 140 immediately turns the thyristor rectifier circuit 110 into a thyristor mode. As a result, the surge current flows into the lower potential line Vss through the thyristor rectifier circuit 110. In other words, the thyristor mode ensuring circuit 140 immediately triggers the thyristor rectifier circuit 110 into a thyristor mode by the surge current applied to the output pad Vout independently of the number of input/output signal bits. This ensures that the the surge current will be prevented from flowing from the CMOS inverter 300 to the lower potential line Vss through the high voltage N-channel MOS transistor HVNMOS1, which results in the prevention of breakdown of the high voltage N-channel MOS transistor HVNMOS1. By this means the electro-static discharge protection circuit 100 reliably protects the CMOS inverter 300 against the surge current applied to the output pad Vout.

Modification

The foregoing description is based on the assumption that the output signal voltage level on an output pad Vout from a logic circuit 1000 is constantly at or under a higher potential Vdd supplied through a higher potential line Vdd and also at or greater than a lower potential Vss supplied through a lower potential line Vss. However, the input/output signal voltage level on an input/output pad Vin/out can be transiently greater than a higher potential Vdd. To manage such a case, the circuit configuration of an electro-static discharge protection circuit 100 is preferably modified in a way explained below, so that the current should be inhibited from flowing from an output pad Vout to a higher potential line Vdd.

Figure 24:
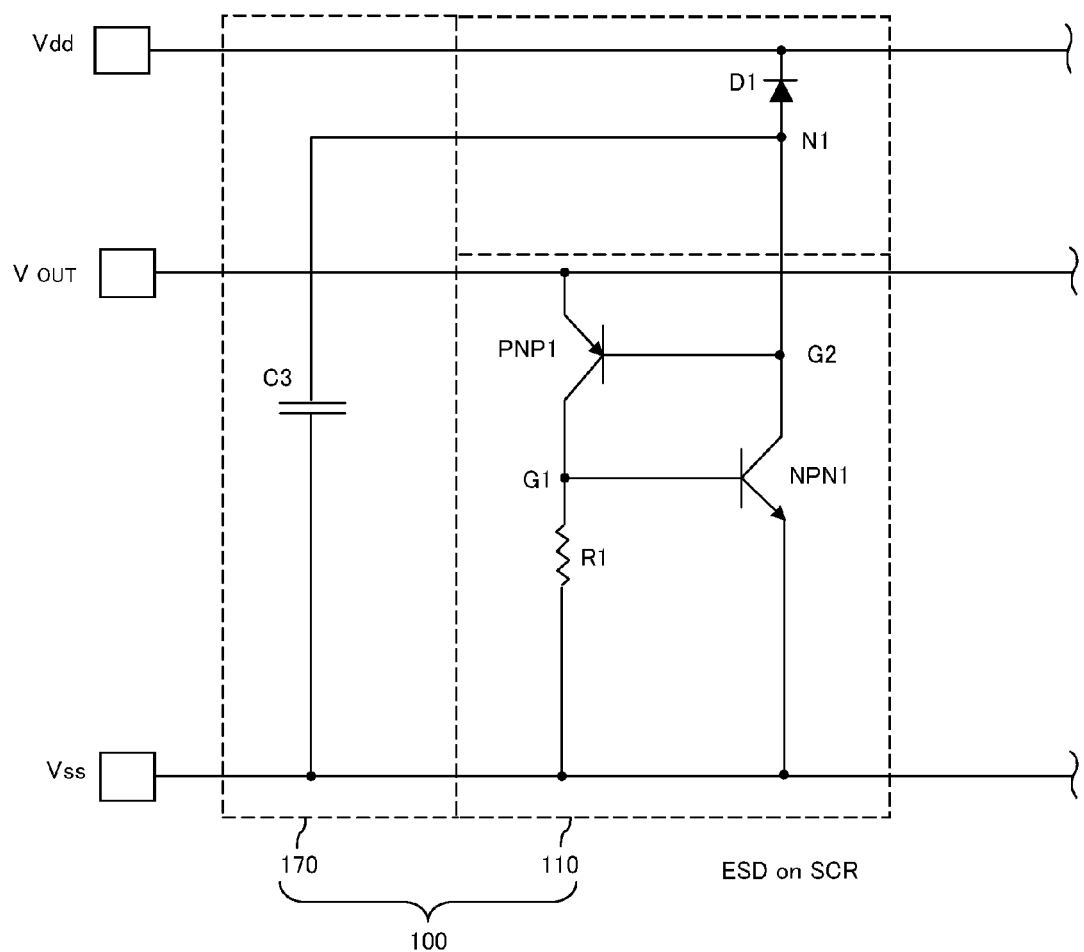
FIG. 24 is an equivalent circuit view of a modification of the electro-static discharge protection circuit according to the third embodiment of the present invention.
Figure 25:
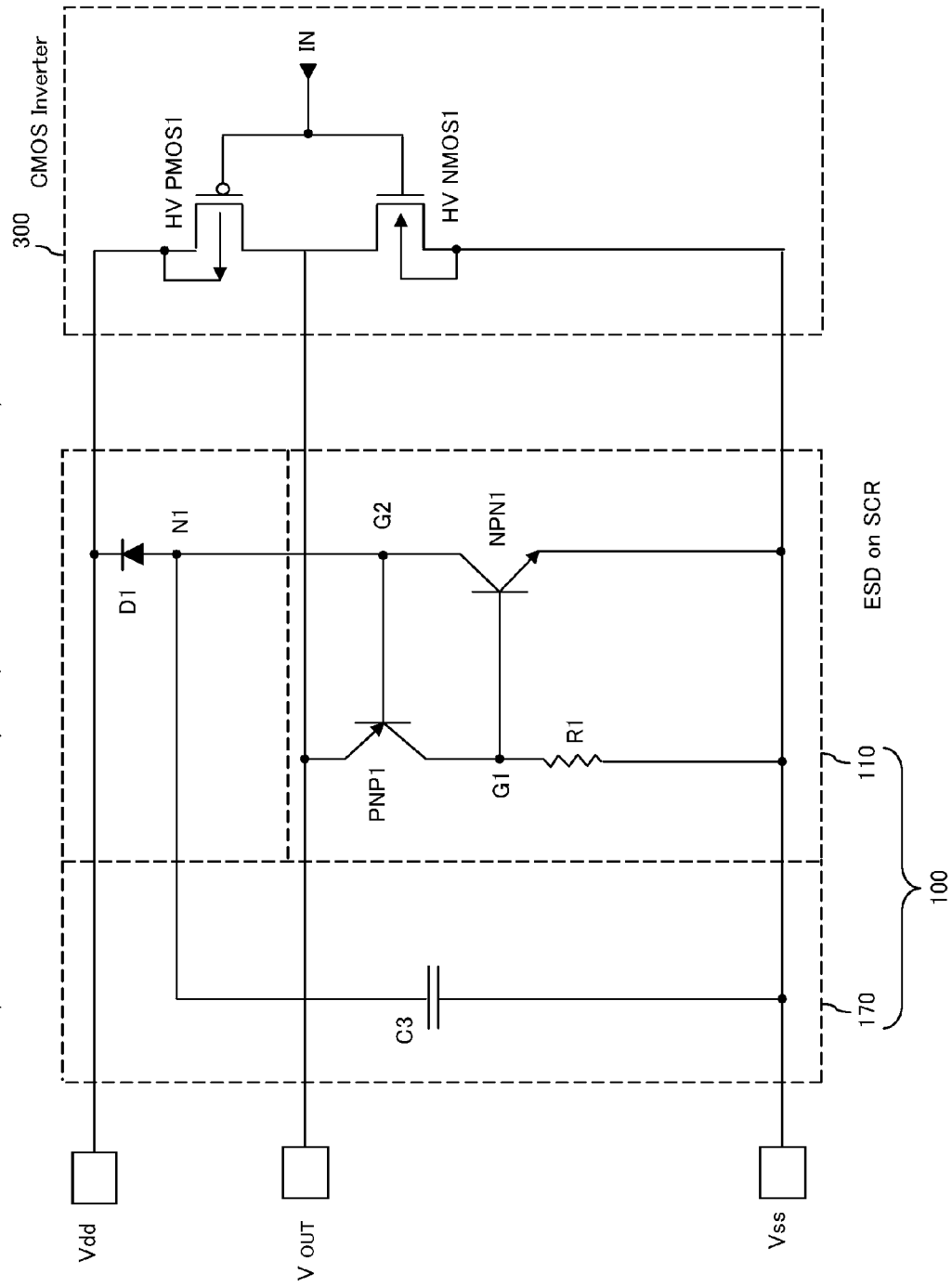
FIG. 25 is an equivalent circuit view of a circuit configuration which includes a modification of the electro-static discharge protection circuit according to the third embodiment of the present invention in FIG. 24, and a CMOS inverter to be protected against a surge current by the electro-static discharge protection circuit.

FIG. 24 is an equivalent circuit view of a modification of the electro-static discharge protection circuit according to the third embodiment of the present invention. FIG. 25 is an equivalent circuit view of a circuit configuration which includes a modification of the electro-static discharge protection circuit according to the third embodiment of the present invention in FIG. 24, and a CMOS inverter to be protected against a surge current by the electro-static discharge protection circuit. The electro-static discharge protection circuit 100 includes a thyristor rectifier circuit 110 and a thyristor mode ensuring circuit 170 which is electrically connected to and functionally coupled to the thyristor rectifier circuit 110.

A thyristor rectifier circuit 110 includes a vertical PNP bipolar transistor PNP1, a lateral NPN bipolar transistor NPN1, and a substrate resistance R1. The vertical PNP bipolar transistor PNP1 has an emitter which is connected to an output pad Vout. The vertical PNP bipolar transistor PNP1 has a collector which is connected to a first terminal G1 and to a lower potential line Vss through the substrate resistance R1. The vertical PNP bipolar transistor PNP1 has a base which is connected to a first node N1 via a second terminal G2. The lateral NPN bipolar transistor NPN1 has a collector which is connected to the base of the vertical PNP bipolar transistor PNP1 via the second terminal G2 and to the first node N1. The lateral NPN bipolar transistor NPN1 has an emitter which is connected to the lower potential line Vss. The lateral NPN bipolar transistor NPN1 has a base which is connected to the lower potential line Vss via the first terminal G1 and through the substrate resistance R1 and to the collector of the vertical PNP bipolar transistor PNP1.

The electro-static discharge protection circuit 100 is formed in a semiconductor substrate. The base of the lateral NPN bipolar transistor NPN1 and the collector of the vertical PNP bipolar transistor PNP1 are connected to the lower potential line Vss through the substrate resistance R1. To achieve this configuration, the base of the lateral NPN bipolar transistor NPN1 and the collector of the vertical PNP bipolar transistor PNP1 are formed in the semiconductor substrate.

The thyristor mode ensuring circuit 170 includes a third capacitive element C3 which is connected between the first node N1 and the lower potential line Vss, and a multistage series connection of a plurality of diodes D1 which are connected between the first node N1 and a higher potential line Vdd. The third capacitive element C3 has a first electrode which is connected to the higher potential line Vdd through the first node N1 and the multistage series connection of a plurality of diodes D1, to the base of the vertical PNP bipolar transistor PNP1, and to the collector of the lateral NPN bipolar transistor NPN1. The collector of the lateral NPN bipolar transistor NPN1 is connected to the higher potential line Vdd through the first node N1 and the multistage series connection of a plurality of diodes D1. Similarly, the base of the vertical PNP bipolar transistor PNP1 is connected to the higher potential line Vdd through the first node N1 and the multistage series connection of a plurality of diodes D1. The third capacitive element C3 has a second electrode which is connected to the lower potential line Vss. Unlike the above chip capacitance of stray capacitances, the capacitance provided by the third capacitive element C3 is constant independently of the number of input/output signal bits.

The multistage series connection of a plurality of diodes D1 between the first node N1 and the higher potential line Vdd inhibits a current from flowing from an output pad Vout into the higher potential line Vdd when a voltage level of an input/output signal on an input/output pad Vin/out transiently exceeds a higher potential Vdd. Here, each of the plurality of diodes D1 is considered to have a forward voltage drop VF. And assuming that an n number of diodes D1 are connected in series, when a current flows from the output pad Vout to the higher potential line Vdd, VF×n will be the sum of the forward voltage drops across the diodes D1 due to the multistage series connection of the n number of diodes D1. Determining the n value so that the VF×n will be greater than the value of the input/output signal voltage on the input/output pad Vin/out minus the higher potential Vdd allows the multistage series connection of the n number of diodes D1 to inhibit a current from flowing from the output pad Vout to the higher potential line Vdd even when a voltage level of an input/output signal on an input/output pad Vin/out transiently exceeds a higher potential Vdd. This prevents power consumption from increasing unnecessarily.

In addition, the multistage series connection of a plurality of diodes D1 between the first node N1 and the higher potential line Vdd does not give any adverse effect on the operation of the electrostatic discharge protection circuit 100 described above, which will be explained below.

When a surge current is applied to the output pad Vout, a current flows from the emitter to the base of the vertical PNP bipolar transistor PNP1. Due to the multistage series connection of a plurality of diodes D1 between the base of the vertical PNP bipolar transistor PNP1 and the higher potential line Vdd, the current further flows from the base to the third capacitive element C3 to charge it. This means the third capacitive element C3 provides a constant and sufficient capacitance independently of the number of input/output signal bits. The third capacitive element C3, other than the stray capacitances, consistently ensures the flow of a surge current applied to the output pad Vout into the third capacitive element C3 through the emitter and the base of the vertical PNP bipolar transistor PNP1 independently of the number of input/output signal bits. As a result, the potential of the base of the vertical PNP bipolar transistor PNP1 rises.

As the base potential rises, and the potential difference between the emitter and the base of the vertical PNP bipolar transistor PNP1 reaches a threshold voltage Vbe, the vertical PNP bipolar transistor PNP1 turns on. This turning on causes the surge current applied to the output pad Vout to flow from the emitter and the collector of the vertical PNP bipolar transistor PNP1 to the lower potential line Vss through the substrate resistance R1. In other words, the collector current of the vertical PNP bipolar transistor PNP1 flows into the semiconductor substrate in which the electro-static discharge protection circuit 100 is formed. This flow causes the voltage across the resistance R1 to drop, and the potential of the semiconductor substrate to rise. Since the potential of the semiconductor substrate is equal to the potential of the base of the lateral NPN bipolar transistor NPN1, the collector current flow into the semiconductor substrate causes both the potential of the semiconductor substrate and the potential of the base of the lateral NPN bipolar transistor NPN1 to rise.

Meanwhile, the emitter of the lateral NPN bipolar transistor NPN1 is fixed at a lower potential supplied through the lower potential line Vss. Thus as the base potential of the lateral NPN bipolar transistor NPN1 rises, and the potential difference between the emitter and the base of the lateral NPN bipolar transistor NPN1 reaches a threshold voltage Vbe, the lateral NPN bipolar transistor NPN1 turns on. This turning on allows the surge current to flow from the collector to the emitter of the lateral NPN bipolar transistor NPN1. In other words, by means of the surge current, the thyristor rectifier circuit 110 is triggered into a thyristor mode.

Therefore, even when the number of input/output signal bits is 1, i.e. the theoretical minimum, the third capacitive element C3 connected between the higher potential line Vdd and the lower potential line Vss ensures that the thyristor rectifier circuit 110 will be triggered into a thyristor mode by a surge current induced by electro-static discharge (ESD) applied to an output pad Vout. Moreover, even when a voltage level of an input/output signal on an output pad Vout transiently exceeds a higher potential Vdd, the multistage series connection of an n number of diodes D1 inhibits a current from flowing from the output pad Vout to the higher potential line Vdd. This prevents power consumption from increasing unnecessarily.

Another modification in which an electrostatic discharge protection circuit 100 is applied to protect a CMOS inverter 300 has the same effect as that described in the above modification, and will not be explained herein below.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An electro-static discharge protection circuit, comprising:
   a first thyristor rectifier circuit that is electrically coupled between first internal circuitry and a first signal input/output section to which a potential that corresponds to either an input signal to the first internal circuitry or an output signal from the first internal circuitry is to be applied, and also electrically coupled between a higher potential line and a lower potential line; and
   a first thyristor mode ensuring circuit that is electrically coupled between the higher potential line and the lower potential line, and also electrically coupled to the first thyristor rectifier circuit, in order to trigger the first thyristor rectifier circuit into a thyristor mode by means of a surge current applied to the first signal input/output section so that the surge current flows into the lower potential line through the first thyristor rectifier circuit in order to protect the first internal circuitry from the surge current,
   the first thyristor mode ensuring circuit comprising an element having a predetermined capacitance that is not stray capacitance.

2. The electro-static discharge protection circuit according to claim 1, wherein the first element is a first capacitive element electrically coupled between the higher potential line and the lower potential line.

3. The electro-static discharge protection circuit according to claim 2, wherein the first thyristor rectifier circuit and the first thyristor mode ensuring circuit are provided in a semiconductor substrate of a first conductivity type, and the first capacitive element comprises a first impurity diffusion region of a second conductivity type provided in the semiconductor substrate, a first dielectric film extending over the first impurity diffusion region, and a first conductive film extending over the first dielectric film.

4. The electro-static discharge protection circuit according to claim 2, wherein the first thyristor rectifier circuit and the first thyristor mode ensuring circuit are provided in a semiconductor substrate of a first conductivity type, and the first capacitive element comprises the semiconductor substrate and a well region of a second conductivity type provided in the semiconductor substrate.

5. The electro-static discharge protection circuit according to claim 2, wherein the first thyristor rectifier circuit and the first thyristor mode ensuring circuit are provided in a semiconductor substrate of a first conductivity type that includes a first element separating film, and the first capacitive element comprises a first conductive film extending over the first element separating film, a first dielectric film extending over the first conductive film, and a second conductive film extending over the first dielectric film.

6. The electro-static discharge protection circuit according to claim 1, wherein the first thyristor rectifier circuit comprises:
   a first bipolar transistor that comprises a first emitter electrically coupled to the first signal input/output section, a first collector electrically coupled to the lower potential line, and a first base electrically coupled to the higher potential line and the first thyristor mode ensuring circuit; and
   a second bipolar transistor that comprises a second emitter electrically coupled to the lower potential line, a second collector electrically coupled to the higher potential line, the first base, and the first thyristor mode ensuring circuit, and a second base electrically coupled to the first collector and the lower potential line.

7. An electro-static discharge protection circuit comprising:
a first thyristor rectifier circuit that is electrically coupled between first internal circuitry and a first signal input/output section to which a potential that corresponds to either an input signal to the first internal circuit or an output signal from the first internal circuitry is to be applied, and also electrically coupled between a higher potential line and a lower potential line; and
a first thyristor mode ensuring circuit that is electrically coupled between the higher potential line and the lower potential line, and also electrically coupled to the first thyristor rectifier circuit in order to trigger the first thyristor rectifier circuit into a thyristor mode by means of a surge current applied to the first signal input/output section so that the surge current flows into the lower potential line through the first thyristor rectifier circuit in order to protect the first internal circuitry from the surge current,
wherein the first thyristor mode ensuring circuit comprises
a first capacitive element electrically coupled between the higher potential line and the lower potential line, and
a first rectifier element that is electrically coupled to the first capacitive element and the first thyristor rectifier circuit, and is also electrically coupled to the higher potential line, the first rectifier element having a first forward breakdown voltage from the first thyristor rectifier circuit to the higher potential line.

8. The electro-static discharge protection circuit according to claim 7, wherein the first rectifier element comprises a plurality of serially connected PN junction diodes.

9. The electro-static discharge protection circuit according to claim 7, wherein the first thyristor rectifier circuit comprises:
a first bipolar transistor that comprises a first emitter electrically coupled to the first signal input/output section, a first collector electrically coupled the lower potential line, and a first base electrically coupled to the first rectifier element and the first thyristor mode ensuring circuit; and
a second bipolar transistor that comprises a second emitter electrically coupled to the lower potential line, a second collector electrically coupled to the first rectifier element, the first base, and the first thyristor mode ensuring circuit, and a second base electrically coupled to the first collector and the lower potential line.

10. A semiconductor device comprising:
first internal circuitry to and from which at least one bit of a digital signal is input and output;
at least one first signal input/output section which is provided for each of the at least one bits, and to which a potential that corresponds to each of the at least one bits is to be applied; and
at least one first electro-static discharge protection circuit which is provided for each of the at least one bits and which is electrically coupled between a corresponding first input/output section of the at least one input/output section and the first internal circuitry, each of the at least one first electro-static discharge protection circuits comprising
a first thyristor rectifier circuit which is electrically coupled to the first internal circuitry and the corresponding first signal input/output section, and is also electrically coupled to a higher potential line and to a lower potential line, and
a first thyristor mode ensuring circuit which is electrically coupled between the higher potential line and the lower potential line and is also electrically coupled to the first thyristor rectifier circuit, in order to trigger the first thyristor rectifier circuit into a thyristor mode by means of a surge current applied to the first signal input/output section so that the surge current flows into the lower potential line through the first thyristor rectifier circuit in order to protect the first internal circuitry from the surge current,
the first thyristor mode ensuring circuit comprising an element having a predetermined capacitance that is not stray capacitance.

11. The semiconductor device according to claim 10, wherein the element is a first capacitive element that is electrically coupled to the higher potential line and the lower potential line.

12. The semiconductor device according to claim 11, wherein the first thyristor rectifier circuit and the first thyristor mode ensuring circuit are provided in a semiconductor substrate of a first conductivity type, and the first capacitive element comprises a first impurity diffusion region of the second conductivity type provided in the semiconductor substrate, a first dielectric film extending over the first impurity diffusion region, and a first conductive film extending over the first dielectric film.

13. The semiconductor device according to claim 12, wherein the first thyristor rectifier circuit and the first thyristor mode ensuring circuit are provided in the semiconductor substrate of the first conductivity type, and wherein the first capacitive element comprises the semiconductor substrate and a well region of a second conductivity type provided in the semiconductor substrate.

14. The semiconductor device according to claim 11, wherein the first thyristor rectifier circuit and the first thyristor mode ensuring circuit are provided in a semiconductor substrate of a first conductivity type, the semiconductor substrate of the first conductivity type comprises a first element separating film, and the first capacitive element comprises a first conductive film extending over the first element separating film, a first dielectric film extending over the first conductive film, and a second conductive film extending over the first dielectric film.

15. The semiconductor device according to claim 10, wherein the first thyristor rectifier circuit comprises:
a first bipolar transistor that comprises a first emitter electrically coupled to the first signal input/output section, a first collector electrically coupled to the lower potential line, and a first base electrically coupled to the higher potential line and the first thyristor mode ensuring circuit; and
a second bipolar transistor that comprises a second emitter electrically coupled to the lower potential line, a second collector electrically coupled to the higher potential line, the first base, and the first thyristor mode ensuring circuit, and a second base electrically coupled to the first collector and the rower potential line.

16. A semiconductor device comprising:
first internal circuitry to and from which at least one bit of a digital signal is input and output;
at least one first signal input/output section which is provided for each of the at least one bits, and to which a potential that corresponds to each of the at least one bits is to be applied; and at least one first electro-static discharge protection circuit which is provided for each of the at least one bits and which is electrically coupled between a corresponding first input/output section of the at least one input/output section and the first internal circuitry, each of the at least one first electro-static discharge protection circuits comprising
- a first thyristor rectifier circuit which is electrically coupled to the first internal circuitry and the corresponding first signal input/output section, and is also electrically coupled to a higher potential line and to a lower potential line, and
- a first thyristor mode ensuring circuit which is electrically coupled between the higher potential line and the lower potential line and is also electrically coupled to the first thyristor rectifier circuit, in order to trigger the first thyristor rectifier circuit into a thyristor mode by means of a surge current applied to the first signal input/output section so that the surge current flows into the lower potential line through the first thyristor rectifier circuit in order to protect the first internal circuitry from the surge current, wherein the first thyristor mode ensuring circuit comprises
- a first capacitive element that is electrically coupled to the higher potential line and the lower potential line, and
- a first rectifier element that is electrically coupled to the first capacitive element and the first thyristor rectifier circuit, and is also electrically coupled to the higher potential line, the first rectifier element having a first forward breakdown voltage from the first thyristor rectifier circuit to the higher potential line.

17. The semiconductor device according to claim 16, wherein the first rectifier element comprises a plurality of serially connected PN junction diodes.

18. The semiconductor device according to claim 16, wherein the first thyristor rectifier circuit comprises:
- a first bipolar transistor that comprises a first emitter electrically coupled to the first corresponding signal input/output section, a fist collector electrically coupled the lower potential line, and a first base electrically coupled to the first rectifier element and the first thyristor mode ensuring circuit; and
- a second bipolar transistor that comprises a second emitter electrically coupled to the lower potential line, a second collector electrically coupled to the first rectifier element, the first base, and the first thyristor mode ensuring circuit, and a second base electrically coupled to the first collector and the lower potential line.

* * * * *